(12) United States Patent
Seok et al.

(10) Patent No.: US 12,094,847 B2
(45) Date of Patent: Sep. 17, 2024

(54) SEMICONDUCTOR PACKAGE AND METHOD OF MANUFACTURING THE SAME

(71) Applicant: SAMSUNG ELECTRONICS CO., LTD., Suwon-si (KR)

(72) Inventors: Seyeong Seok, Cheonan-si (KR);
Un-Byoung Kang, Hwaseong-si (KR);
Chungsun Lee, Asan-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 17/329,980

(22) Filed: May 25, 2021

(65) Prior Publication Data
US 2022/0157757 A1    May 19, 2022

(30) Foreign Application Priority Data

Nov. 17, 2020   (KR) ........................ 10-2020-0153682

(51) Int. Cl.
*H01L 23/498* (2006.01)
*H01L 21/56* (2006.01)
(Continued)

(52) U.S. Cl.
CPC ............ *H01L 24/16* (2013.01); *H01L 21/561* (2013.01); *H01L 21/563* (2013.01);
(Continued)

(58) Field of Classification Search
CPC ........... H01L 23/49894; H01L 25/0657; H01L 25/043; H01L 25/074; H01L 25/0756; H01L 25/117; H01L 2224/08145; H01L 2224/023–024; H01L 2224/0235; H01L 2224/02372; H01L 2224/02373; H01L 23/49822; H01L 23/5383; H01L 23/3185;
(Continued)

(56) References Cited

U.S. PATENT DOCUMENTS 8,557,680 B2   10/2013   Chandrasekaran et al.
8,878,360 B2   11/2014   Meyer et al.
(Continued)

FOREIGN PATENT DOCUMENTS

CN   1363952 A    8/2002
CN   102931102 A  2/2013

*Primary Examiner* — Younes Boulghassoul
*Assistant Examiner* — Quinton A Brasfield
(74) *Attorney, Agent, or Firm* — Sughrue Mion, PLLC

(57) ABSTRACT

A semiconductor package may include: a first redistribution substrate; a first die above the first redistribution substrate; a second redistribution substrate on the first die; a first bump formed on the first die, and connecting the first die to the second redistribution substrate; a first molding portion enclosing the first die and surrounding the first bump; and an outer terminal on a bottom surface of the first redistribution substrate, wherein the second redistribution substrate comprises an insulating pattern and a conductive pattern in the insulating pattern to be in contact with the first bump, and wherein, at an interface of the second redistribution substrate and the first bump, the conductive pattern of the second redistribution substrate and the first bump are formed of the same material to form a single body or structure.

19 Claims, 18 Drawing Sheets

(51) Int. Cl.
*H01L 23/00* (2006.01)
*H01L 23/31* (2006.01)
*H01L 25/00* (2006.01)
*H01L 25/065* (2023.01)
*H01L 25/10* (2006.01)
*H01L 25/18* (2023.01)

(52) U.S. Cl.
CPC ........ *H01L 21/568* (2013.01); *H01L 23/3121* (2013.01); *H01L 23/49822* (2013.01); *H01L 23/49838* (2013.01); *H01L 24/13* (2013.01); *H01L 24/17* (2013.01); *H01L 24/73* (2013.01); *H01L 24/96* (2013.01); *H01L 24/97* (2013.01); *H01L 25/0657* (2013.01); *H01L 25/105* (2013.01); *H01L 25/50* (2013.01); *H01L 25/18* (2013.01); *H01L 2224/13005* (2013.01); *H01L 2224/13024* (2013.01); *H01L 2224/16146* (2013.01); *H01L 2224/16227* (2013.01); *H01L 2224/17181* (2013.01); *H01L 2224/73104* (2013.01); *H01L 2224/73259* (2013.01); *H01L 2224/73267* (2013.01); *H01L 2224/95001* (2013.01); *H01L 2225/06513* (2013.01); *H01L 2225/06517* (2013.01); *H01L 2225/06541* (2013.01); *H01L 2225/06565* (2013.01); *H01L 2225/1035* (2013.01); *H01L 2924/1431* (2013.01); *H01L 2924/1436* (2013.01); *H01L 2924/1437* (2013.01); *H01L 2924/1438* (2013.01); *H01L 2924/1443* (2013.01)

(58) Field of Classification Search
CPC ............... H01L 23/3157; H01L 21/563; H01L 25/0652; H01L 25/071; H01L 25/112; H01L 27/0688; H01L 23/49827; H01L 23/5384; H01L 23/481; H01L 29/4175; H01L 2225/06541–06544; H01L 2225/06548; H01L 21/76898; H01L 2225/1035; H01L 23/5389
See application file for complete search history.

(56) References Cited

U.S. PATENT DOCUMENTS

| | | | |
|---|---|---|---|
| 9,691,726 | B2 | 6/2017 | Cheng et al. |
| 10,083,939 | B2* | 9/2018 | Seo ..................... H01L 25/0657 |
| 10,515,926 | B2 | 12/2019 | Shen et al. |
| 10,546,834 | B2 | 1/2020 | Wang et al. |
| 10,665,572 | B2 | 5/2020 | Chen et al. |
| 10,854,565 | B2* | 12/2020 | Chen ........................ H01L 24/19 |
| 2011/0057327 | A1* | 3/2011 | Yoshida ................. H01L 23/544 |
| | | | 257/777 |
| 2015/0179545 | A1* | 6/2015 | Jeong ..................... H01L 23/481 |
| | | | 257/621 |
| 2016/0155731 | A1 | 6/2016 | Tung et al. |
| 2019/0006315 | A1* | 1/2019 | Hsu ........................... H01L 24/11 |
| 2020/0294964 | A1* | 9/2020 | Min ....................... H01L 23/295 |
| 2021/0098421 | A1* | 4/2021 | Wu ..................... H01L 23/49811 |
| 2021/0327819 | A1* | 10/2021 | Fang ..................... H01L 25/0652 |
| 2021/0384134 | A1* | 12/2021 | Liu ....................... H01L 25/0657 |

* cited by examiner

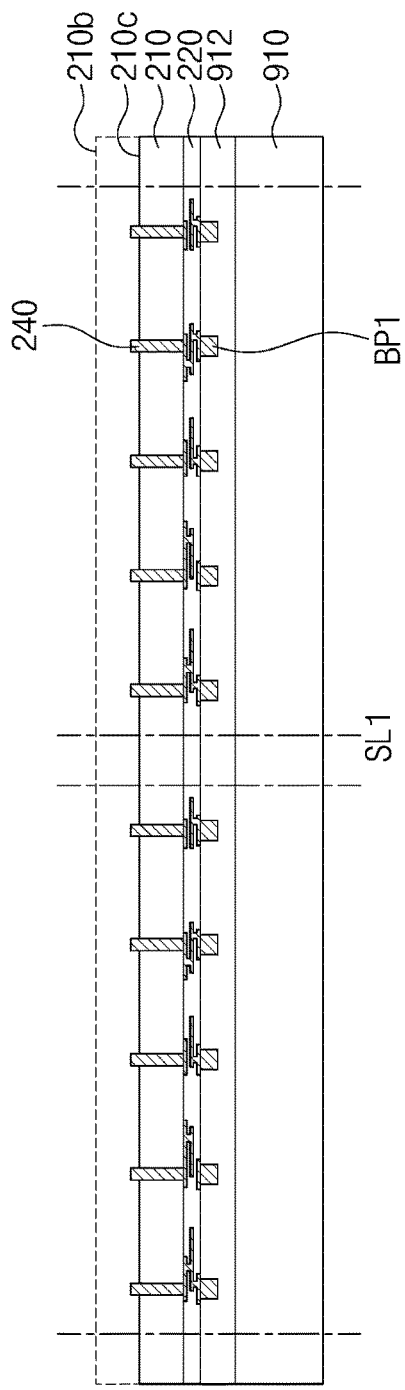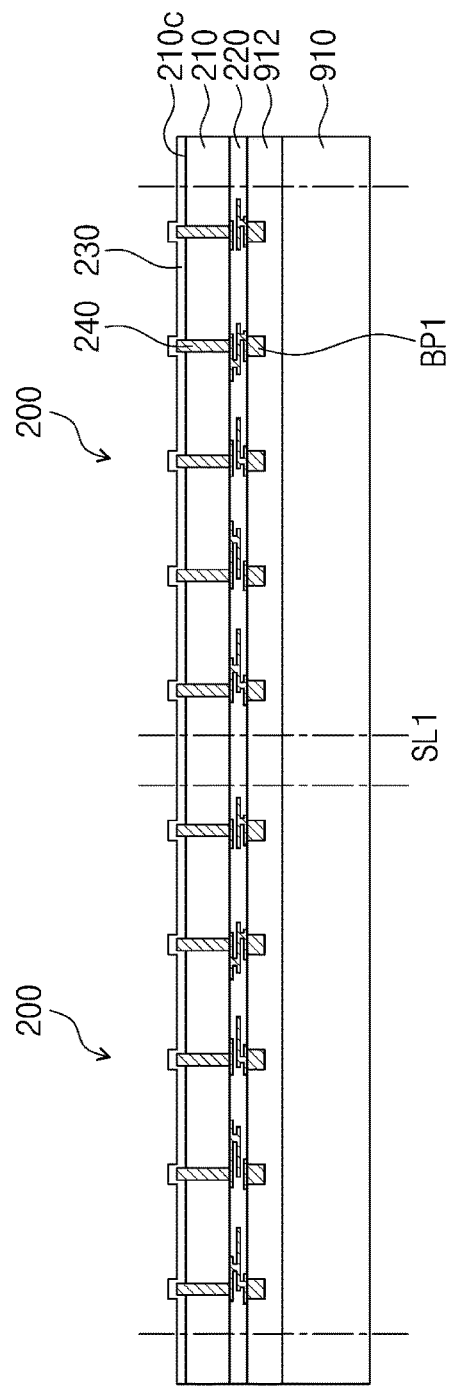

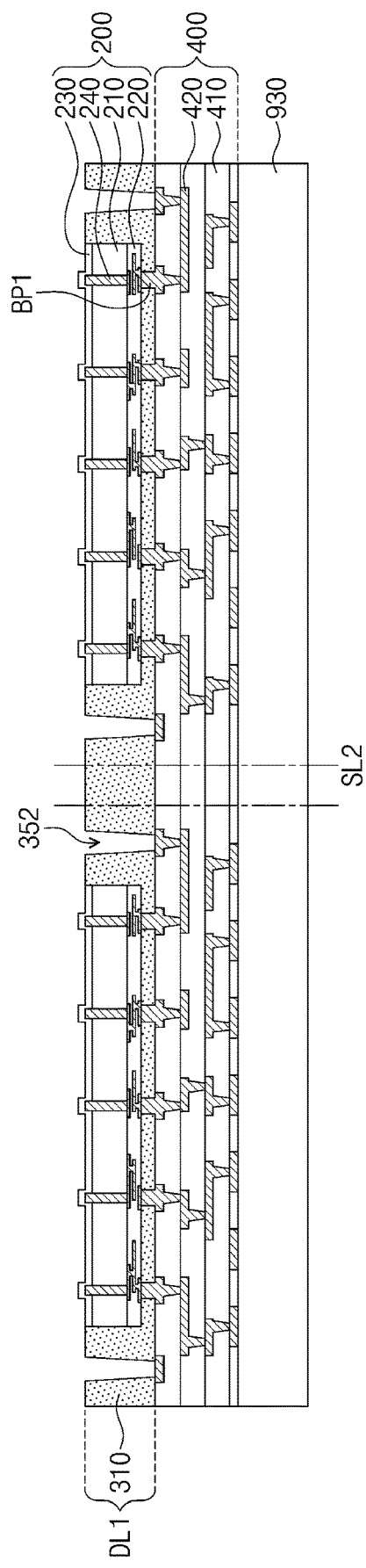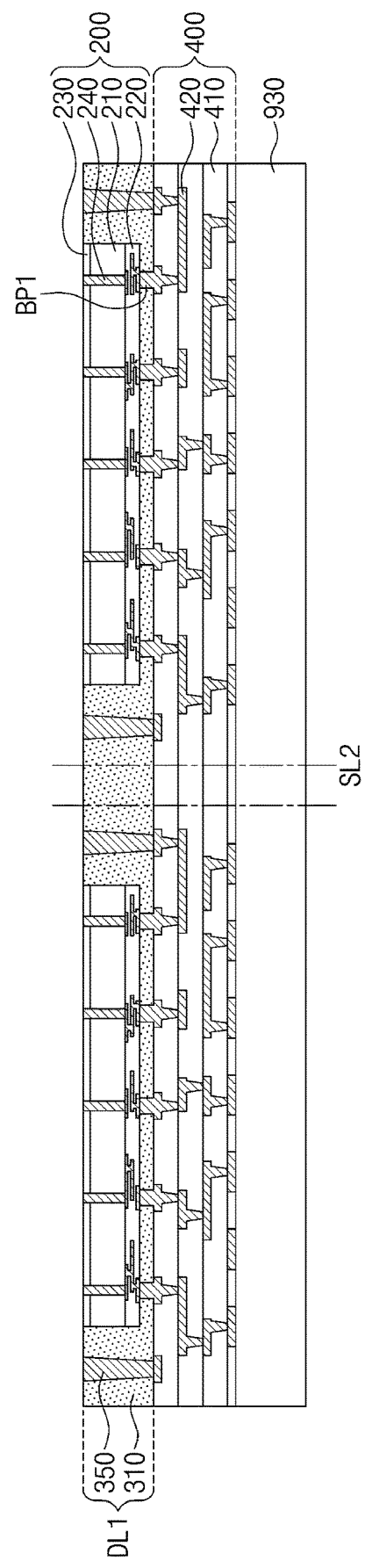

SEMICONDUCTOR PACKAGE AND METHOD OF MANUFACTURING THE SAME

CROSS-REFERENCE TO THE RELATED APPLICATIONS

This patent application claims priority from Korean Patent Application No. 10-2020-0153682, filed on Nov. 17, 2020 in the Korean Intellectual Property Office, the entire disclosure of which is hereby incorporated herein by reference.

BACKGROUND

1. Field

The present disclosure relates to a semiconductor package and a method of manufacturing the same, and in particular, to a semiconductor package including vertically-stacked integrated circuits and a method of manufacturing the same.

2. Related Art

With the recent advance in the electronics industry, demand for high-performance, high-speed and compact electronic components are increasing. To meet this demand, packaging technologies of mounting a plurality of semiconductor chips in a single package are being developed.

Recently, demand for portable electronic devices is rapidly increasing in the market, and thus, it is necessary to reduce sizes and weights of electronic components constituting the portable electronic devices. For this, it is necessary to develop technologies of reducing a size and a weight of each component and packaging technologies of integrating several components in a single package. In particular, for a semiconductor package used to process high frequency signals, it is necessary not only to reduce a size of a product but also to realize good electrical characteristics.

SUMMARY

It is an aspect to provides a semiconductor package with improved structural stability and a method of manufacturing the same.

According to an aspect of an example embodiment, there is provided a semiconductor package that may include: a first redistribution substrate; a first die above the first redistribution substrate; a second redistribution substrate on the first die; a first bump formed on the first die, and connecting the first die to the second redistribution substrate; a first molding portion enclosing the first die and surrounding the first bump; and an outer terminal on a bottom surface of the first redistribution substrate, wherein the second redistribution substrate includes an insulating pattern and a conductive pattern in the insulating pattern to be in contact with the first bump, and wherein, at an interface of the second redistribution substrate and the first bump, the conductive pattern of the second redistribution substrate and the first bump are formed of the same material to form a single body or structure.

According to an aspect of an example embodiment, there is provided a semiconductor package that may include: a first redistribution substrate, a first device layer on the first redistribution, a second device layer on the first device layer, a second redistribution substrate on the second device layer, and outer terminals on a bottom surface of the first redistribution substrate. Each of the first device layer and the second device layer may include a die including a circuit layer which faces the second redistribution substrate, a via penetrating the die and coupled to the circuit layer, a bump formed on the die and coupled to the circuit layer, and a molding portion surrounding the die and the bump. A top surface of the molding portion and a top surface of the bump may be coplanar with each other, and the second redistribution substrate may include an insulating pattern and a conductive pattern in the insulating pattern. The conductive pattern may be coupled to the bump of the second device layer.

According to an aspect of an example embodiment, there is provided a method of manufacturing a semiconductor package. The method may include: forming a first die, which includes a first base layer, a first circuit layer on the first base layer, and a first via provided to penetrate the first base layer and coupled to the first circuit layer; forming a first pad on the circuit layer of the first die, the first pad being coupled to the first circuit layer; placing the first die on a first carrier substrate such that the first base layer faces the first carrier substrate; coating the first carrier substrate with a molding material to form a first molding portion encapsulating the first die; performing a planarization process on the first molding portion to expose the first pad; bonding the first die to a first redistribution substrate such that the first pad is coupled to the first redistribution substrate; removing the first carrier substrate to expose the first base layer; forming a penetration electrode to penetrate the first molding portion in a region around the first die and to be coupled to the first redistribution substrate; and forming a second redistribution substrate on the first molding portion and the first base layer of the first die.

BRIEF DESCRIPTION OF THE DRAWINGS

FIGS. 8 to 26 illustrate sectional views showing a method of manufacturing a semiconductor package, according to embodiments.

DETAILED DESCRIPTION

The embodiments described herein are all example embodiments, and thus, the inventive concept is not limited thereto and may be realized in various other forms. Each of the embodiments provided in the following description is not excluded from being associated with one or more features of another example or another embodiment also provided herein or not provided herein but consistent with the inventive concept.

As used herein, expressions such as "at least one of," when preceding a list of elements, modify the entire list of elements and do not modify the individual elements of the list. For example, the expression, "at least one of a, b, and c," should be understood as including only a, only b, only c, both a and b, both a and c, both b and c, or all of a, b, and c.

It will be understood that when an element or layer is referred to as being "over," "above," "on," "below," "under," "beneath," "connected to" or "coupled to" another element or layer, it can be directly over, above, on, below, under, beneath, connected or coupled to the other element or layer or intervening elements or layers may be present. In contrast, when an element is referred to as being "directly over," "directly above," "directly on," "directly below," "directly under," "directly beneath," "directly connected to" or "directly coupled to" another element or layer, there are no intervening elements or layers present. Like numerals refer to like elements throughout.

Spatially relative terms, such as "over," "above," "on," "upper," "below," "under," "beneath," "lower," and the like, may be used herein for ease of description to describe one element's or feature's relationship to another element(s) or feature(s) as illustrated in the figures. It will be understood that the spatially relative terms are intended to encompass different orientations of the device in use or operation in addition to the orientation depicted in the figures.

Figure 1:
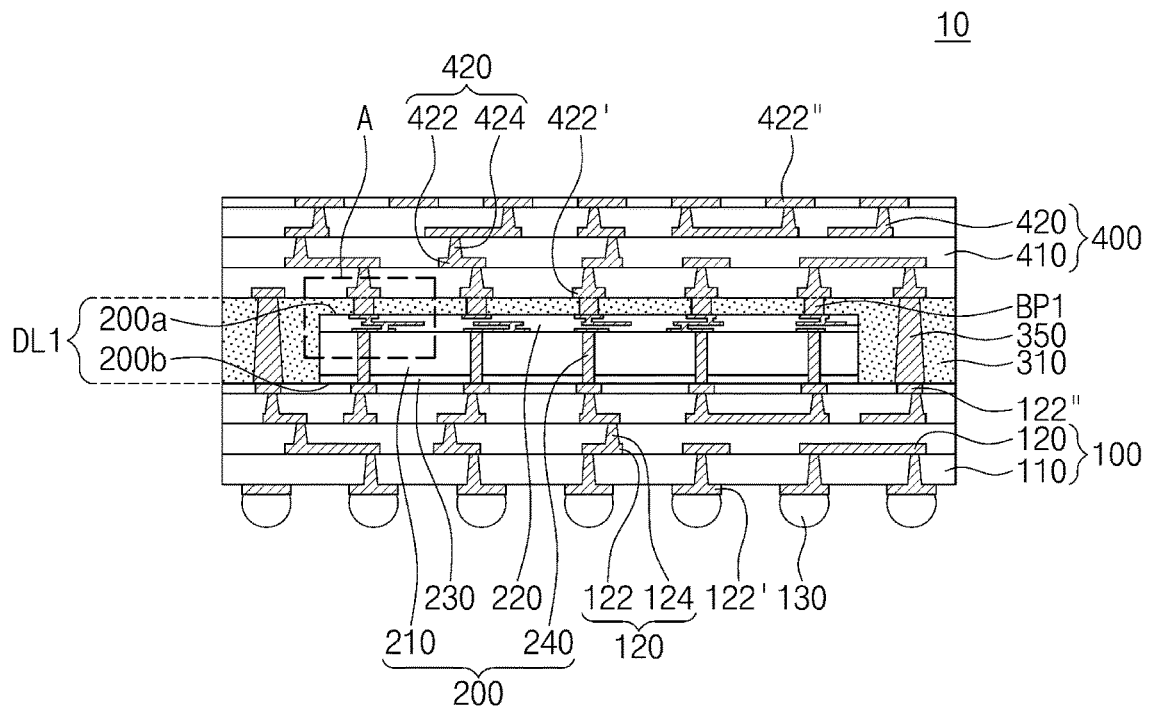
FIG. 1 illustrates a sectional view showing a semiconductor package, according to an embodiment.
Figure 2:
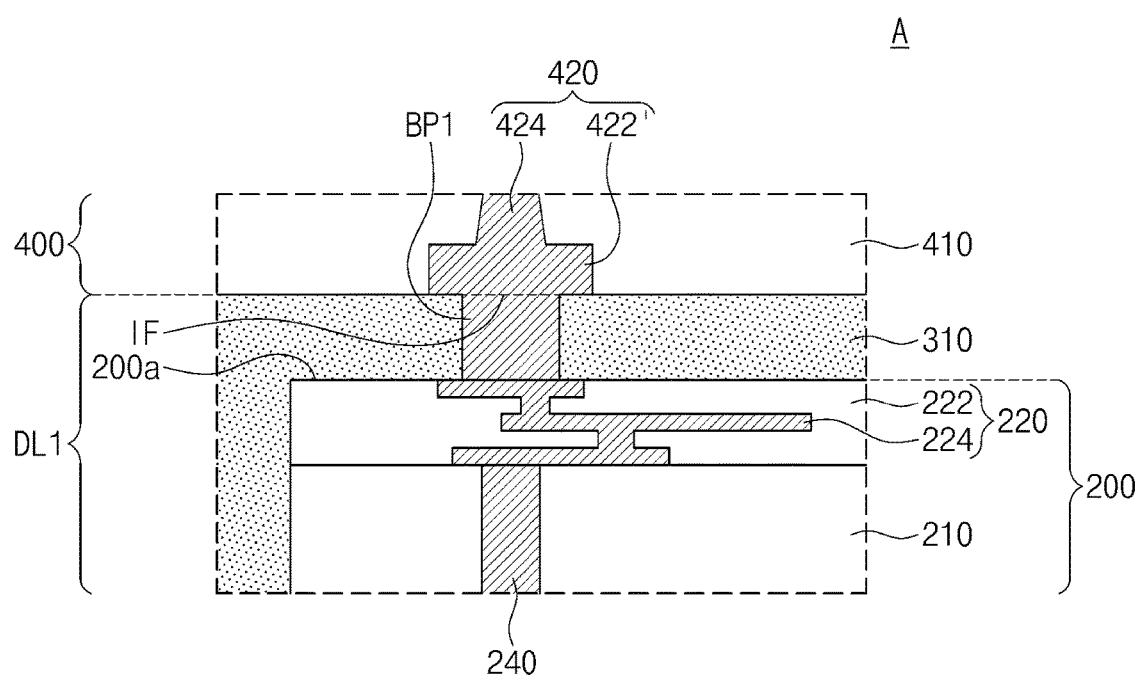
FIGS. 2 to 4 illustrate enlarged sectional views showing a portion A of FIG. 1.
Figure 3:
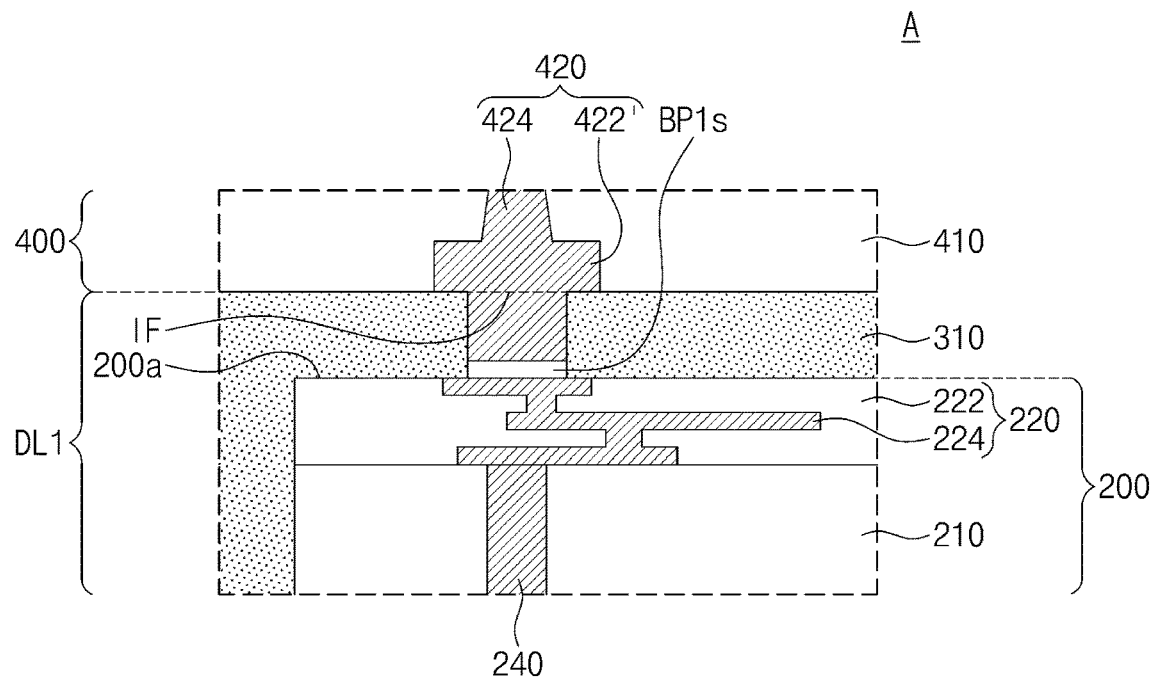
Figure 4:
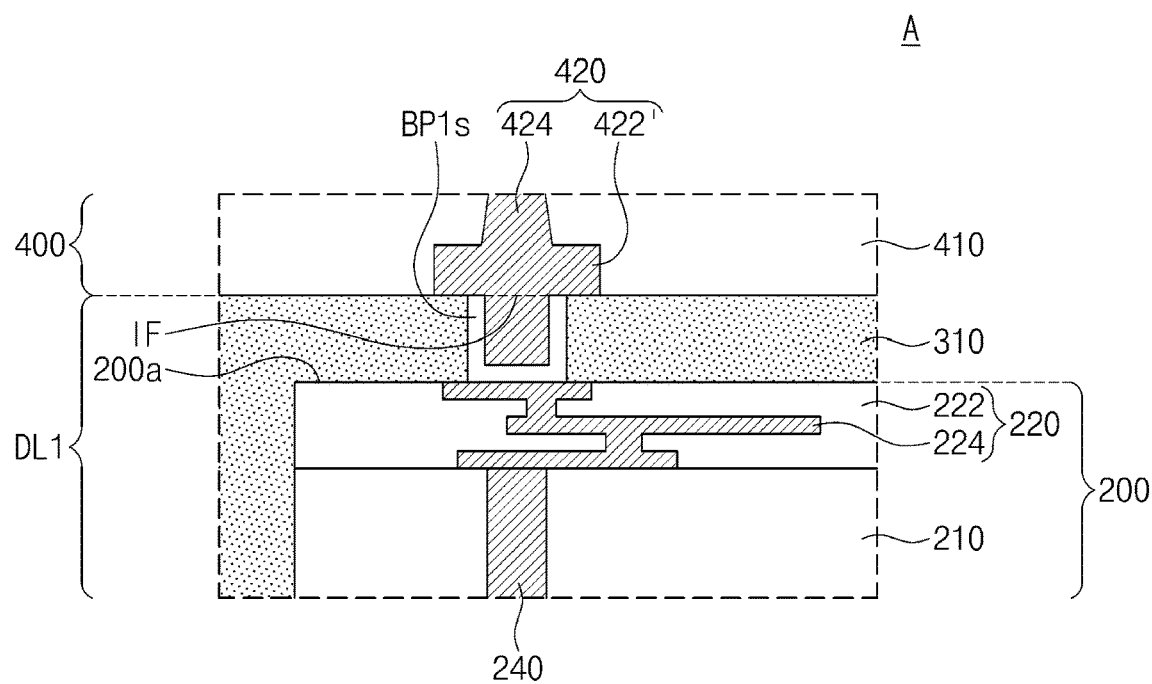

FIG. 1 illustrates a sectional view showing a semiconductor package, according to an embodiment. FIGS. 2 to 4 illustrate enlarged sectional views showing a portion A of FIG. 1.

Referring to FIG. 1, a semiconductor package 10 may include a first redistribution substrate 100, a first device layer DL1, and a second redistribution substrate 400.

In an embodiment, the first redistribution substrate 100 may be provided to include a plurality of first redistribution layers which are stacked.

Each of the first redistribution layers may include a first insulating pattern 110 and a first conductive pattern 120, which is provided in the first insulating pattern 110. The first conductive patterns 120 in adjacent ones of the first redistribution layers may be electrically connected to each other. The structure of one of the first redistribution layers will be described in more detail below.

The first insulating pattern 110 may be formed of or include at least one of insulating polymers or photo-imageable polymers (PIDs). For example, the photo-imageable polymers may include photo-imageable polyimides, polybenzoxazole (PBO), phenol-based polymers, and benzocyclobutene-based polymers. The first insulating pattern 110 may be formed of a single layer or may be a multi-layered structure including a plurality of stacked layers. In the case where the first insulating pattern 110 has the multi-layered structure, the layers thereof may be formed of the same material or at least two different materials.

The first conductive pattern 120 may be provided in the first insulating pattern 110. The first conductive pattern 120 may have a damascene structure. The first conductive pattern 120 may have a cross-section that is shaped like an inverted character 'T'. For example, the first conductive pattern 120 may include a head portion 122 and a tail portion 124, which are connected to form a single body or structure, and respectively corresponds to a horizontal stroke and a vertical stroke of the character 'T'. The head portion 122 may correspond to a wiring pattern, which is used to redistribute or modify horizontal routing paths to a first die 200 to be described below, whereas the tail portion 124 may correspond to a via pattern, which vertically connects the first conductive patterns 120 in the first redistribution layers to each other. The head portion 122 and the tail portion 124 may be vertically overlapped with each other, and the tail portion 124 may be extended from the head portion 122 toward a top surface of the first insulating pattern 110. The head portion 122 and the tail portion 124 may be provided to have no interface therebetween. A bottom surface of the first conductive pattern 120 may be provided at the same level as the bottom surface of the first insulating pattern 110. The first conductive pattern 120 in the lowermost one of the first redistribution layers may include a head portion 122', which is exposed to the outside of the first insulating pattern 110 near the bottom surface of the first insulating pattern 110. The head portion 122' of the first conductive pattern 120 in the lowermost first redistribution layer may be a pad, which will be coupled to outer terminals 130 to be described below. The first conductive pattern 120 in the uppermost one of the first redistribution layers may have only a head portion 122", without the tail portion 124, and in this case, the head portion 122" may be exposed to the outside of the first insulating pattern 110 near the top surface of the first insulating pattern 110. The head portion 122" may be a pad, on which the first die 200 will be mounted. A top surface of the tail portion 124 may be provided at the same level as the top surface of the first insulating pattern 110. The first conductive pattern 120 may be formed of or include at least one of conductive materials. For example, the first conductive pattern 120 may be formed of or include copper (Cu).

Although not shown, a barrier layer may be interposed between the first insulating pattern 110 and the first conductive pattern 120. The barrier layer may be provided to surround the head and tail portions 122 and 124 of the first conductive pattern 120. A gap between the first conductive pattern 120 and the first insulating pattern 110 may have a thickness (i.e., a thickness of the barrier layer) ranging from 50 Å to 1000 Å. The barrier layer may be formed of or include at least one of titanium (Ti), tantalum (Ta), titanium nitride (TiN), or tantalum nitride (TaN).

The outer terminals 130 may be provided below the first redistribution substrate 100. The outer terminals 130 may be respectively coupled to the first conductive patterns 120 of the lowermost first redistribution layer. The outer terminals 130 may include solder balls or solder bumps.

The first device layer DL1 may be provided on the first redistribution substrate 100. The first device layer DL1 may include the first die 200, a first molding portion 310 surrounding the first die 200, and at least one first bump BP1 connected to the first die 200.

The first die 200 may be disposed on a top surface of the first redistribution substrate 100. The first die 200 may be a memory chip, e.g., dynamic random-access memory (DRAM), static random-access memory (SRAM), magnetoresistive random-access memory (MRAM), or FLASH memory chips. Alternatively, the first die 200 may be a logic chip. The first die 200 may have a front surface 200a and a rear surface 200b. In the present specification, the term "front surface" will be used to refer to a surface, which is adjacent to an active surface of a semiconductor die or an integrated device, and on which pads of the semiconductor die are formed, and the term "rear surface" will be used to refer to a surface that is opposite to the front surface. The front surface 200a of the first die 200 may face in the direction of the second redistribution substrate 400. The first die 200 may include a first base layer 210, a first circuit layer 220 and a first passivation layer 230. The first circuit layer 220 and the first passivation layer 230 may be provided on opposite surfaces of the first base layer 210. The first die 200 may also include at least one first via 240, which is provided to penetrate the first base layer 210.

The first base layer 210 may be formed of or include silicon (Si). In an embodiment, an integrated device or integrated circuits may be formed at an upper portion of the first base layer 210.

The first circuit layer 220 may be provided on a top surface of the first base layer 210. The first circuit layer 220 may be electrically connected to the integrated device or the integrated circuits, which are formed in the first base layer 210. For example, the first circuit layer 220 may include an insulating pattern 222 and a circuit pattern 224 provided in the insulating pattern 222, and the circuit pattern 224 may be coupled to the integrated device or the integrated circuits, which are formed in the first base layer 210. A portion of the circuit pattern 224 may be exposed to the outside of the first circuit layer 220 near the top surface of the first circuit layer 220, and the exposed portion of the circuit pattern 224 may be used as a pad of the first die 200. The front surface 200a, that is, the top surface, of the first die 200 provided by the first circuit layer 220 may correspond to an active surface of the first die 200.

The first passivation layer 230 may be provided on a bottom surface of the first base layer 210. The first passivation layer 230 may be formed of or include at least one of insulating materials. For example, the first passivation layer 230 may be formed of or include silicon nitride (SiN), silicon oxide (SiO), or silicon oxynitride (SiON).

The first via 240 may be provided to vertically penetrate the first base layer 210 and the first passivation layer 230. An end portion of the first via 240 may be exposed to the outside of the first die 200 near a bottom surface of the first passivation layer 230. Here, the first via 240 may have a bottom surface that is substantially coplanar with the bottom surface of the first passivation layer 230 (i.e., the rear surface 200b of the first die 200), and the bottom surfaces of the first via 240 and the first passivation layer 230 may be substantially flat. An opposite end of the first via 240 may be extended toward the front surface 200a of the first die 200, and may be in contact with the first circuit layer 220. The first via 240 may be coupled to the circuit pattern 224 of the first circuit layer 220.

The first die 200 may be mounted on the first redistribution substrate 100. For example, the first passivation layer 230 of the first die 200 may be in contact with the top surface of the first redistribution substrate 100. Here, the first via 240 of the first die 200 may be coupled to the head portion 122" of the first conductive pattern 120 in the uppermost first redistribution layer.

Referring to FIGS. 1 and 2, at least one first bump BP1 may be provided on the front surface 200a of the first die 200. The first bump BP1 may be electrically connected to the first circuit layer 220. For example, the first bump BP1 may be coupled to an exposed portion of the circuit pattern 224. A thickness of the first bump BP1 may range from 0.1 mm to 10 mm. A width of the first bump BP1 may be substantially constant throughout its height from the front surface 200a of the first die 200. The first bump BP1 may be formed of or include copper (Cu).

Unlike the structure shown in FIG. 2, the first bump BP1 may further include a seed layer BP1s. The seed layer BP1s may be formed on a bottom surface of the first bump BP1, as shown in FIG. 3. The seed layer BP1s may be interposed between the first bump BP1 and the circuit pattern 224 of the first die 200. Alternatively, as shown in FIG. 4, the seed layer BP1s may be formed on the bottom surface and the side surfaces of the first bump BP1. The seed layer BP1s may be extended from a region between the first bump BP1 and the circuit pattern 224 to cover at least a portion of the side surfaces of the first bump BP1. The description that follows will refer to the embodiment of FIG. 2.

Referring further to FIGS. 1 and 2, the first molding portion 310 may be provided on the first redistribution substrate 100. The first molding portion 310 may cover at least a portion of the top surface of the first redistribution substrate 100. The first molding portion 310 may be provided to surround the first die 200, when viewed in a plan view. The first molding portion 310 may cover side surfaces of the first die 200 and may also cover the front surface 200a of the first die 200. Here, the first molding portion 310 may be provided to enclose the first bump BP1 but may not cover a top surface of the first bump BP1. A top surface of the first molding portion 310 may be substantially coplanar with the top surface of the first bump BP1. A bottom surface of the first molding portion 310 may be substantially coplanar with the bottom surface of the first die 200. The first molding portion 310 may be formed of or include at least one of insulating materials (e.g., an epoxy molding compound (EMC)).

A penetration electrode 350 may be provided on the first redistribution substrate 100. The penetration electrode 350 may be disposed in a region around the first die 200. The penetration electrode 350 may be provided to vertically penetrate the first molding portion 310. An end portion of the penetration electrode 350 may be extended toward the first redistribution substrate 100 and may be coupled to the first conductive pattern 120 in the uppermost first redistribution layer of the first redistribution substrate 100. The bottom surface of the penetration electrode 350 may be substantially coplanar with the bottom surface of the first molding portion 310 and the bottom surface of the first passivation layer 230 of the first die 200. An opposite end of the penetration electrode 350 may be exposed to the outside of the first molding portion 310 near the top surface of the first molding portion 310. The penetration electrode 350 may have a top surface that is substantially coplanar with the top surface of the first molding portion 310 and the top surface of the first bump BP1. A width of the penetration electrode 350 may decrease in an upward direction from the first redistribution substrate 100. Alternatively, the width of the penetration electrode 350 may be substantially constant throughout its height from its bottom surface.

Although not shown, a seed layer may be interposed between the penetration electrode 350 and the first molding portion 310. The seed layer may be provided to surround side and top surfaces of the penetration electrode 350. The seed layer may be formed of or include at least one of titanium (Ti) or tantalum (Ta), or the same material forming the barrier layer interposed between the first insulating pattern 110 and the first conductive pattern 120.

The second redistribution substrate 400 may be provided on the first device layer DL1. The second redistribution substrate 400 may be in contact with the top surface of the first molding portion 310 and the top surface of the first bump BP1. The second redistribution substrate 400 may include a plurality of second redistribution layers which are stacked.

Each of the second redistribution layers may include a second insulating pattern 410 and a second conductive pattern 420, which is provided in the second insulating pattern 410. The second conductive patterns 420 in adjacent ones of the second redistribution layers may be electrically connected to each other. The structure of one of the second redistribution layers will be described in more detail below.

The second insulating pattern 410 may be formed of or include at least one of insulating polymers or photo-imageable polymers (PIDs). For example, the photo-imageable polymers may include photo-imageable polyimides, polybenzoxazole (PBO), phenol-based polymers, and benzocyclobutene-based polymers. The second insulating pattern 410 may be formed of a single layer or may be a multi-layered structure including a plurality of stacked layers.

The second conductive pattern 420 may be provided in the second insulating pattern 410. The second conductive pattern 420 may have a damascene structure. The second conductive pattern 420 may have a cross-section that is shaped like an inverted character 'T'. For example, the second conductive pattern 420 may include a head portion 422 and a tail portion 424, which are connected to form a single body or structure. The head portion 422 may correspond to a wiring pattern, which is used to redistribute or modify horizontal routing paths to the first die 200, and the tail portion 424 may correspond to a via pattern, which vertically connects the second conductive patterns 420 in the first redistribution layers to each other. The head portion 422 and the tail portion 424 may be vertically overlapped with each other, and the tail portion 424 may be extended from the head portion 422 toward the top surface of the second insulating pattern 410. The head portion 422 and the tail portion 424 may be provided to have no interface therebetween. The second conductive pattern 420 may have a bottom surface that is located at the same level as the bottom surface of the second insulating pattern 410. The second conductive pattern 420 in the lowermost second redistribution layer may include a head portion 422', which is exposed to the outside of the second redistribution substrate 400 near the bottom surface of the second insulating pattern 410. The head portion 422' may be a pad, to which the first bump BP1 is coupled. The second conductive pattern 420 in the uppermost second redistribution layer may have only a head portion 422", without the tail portion 424, and in this case, the head portion 422" may be exposed to the outside of the second redistribution substrate 400 near the top surface of the second insulating pattern 410. The head portion 422" may be a pad, on which an additional semiconductor package or device can be mounted. The tail portion 424 may have a top surface that is located at the same level as the top surface of the second insulating pattern 410. The second conductive pattern 420 may be formed of or include at least one of conductive materials. For example, the second conductive pattern 420 may be formed of or include copper (Cu).

Although not shown, a barrier layer may be interposed between the second insulating pattern 410 and the second conductive pattern 420. The barrier layer may be provided to surround the head and tail portions 422 and 424 of the second conductive pattern 420. The barrier layer may be formed of or include at least one of titanium (Ti), tantalum (Ta), titanium nitride (TiN), or tantalum nitride (TaN).

The second redistribution substrate 400 may be electrically connected to the first die 200 and the penetration electrode 350. For example, the first bump BP1 and the penetration electrode 350 may be coupled to the head portion 422' of the second conductive pattern 420 in the lowermost second redistribution layer of the second redistribution substrate 400. The second conductive pattern 420 or the head portion 422' and the first bump BP1 may be bonded to each other to form a metal-metal hybrid bonding structure. In the present disclosure, the hybrid bonding structure may mean a bonding structure, in which two materials of the same kind are fused at an interface therebetween. For example, the second conductive pattern 420 or the head portion 422' may be continuously connected to the first bump BP1 and thus, there may be no observable interface IF (e.g., depicted by the dotted line in FIGS. 1 and 2) between the second conductive pattern 420 or the head portion 422' and the first bump BP1. As an example, the second conductive pattern 420 or the head portion 422' and the first bump BP1 may be formed of or include the same material, and in this case, there may be no interface between the second conductive pattern 420 or the head portion 422' and the first bump BP1. In other words, the second conductive pattern 420 or the head portion 422' and the first bump BP1 may be provided as a single body or structure. The second redistribution substrate 400 and the first die 200 may be electrically connected to each other through the second conductive pattern 420 or the head portion 422' and the first bump BP1.

The semiconductor package 10 may be provided to have the afore-described structure.

According to an embodiment, the first molding portion 310 of the first device layer DL1 may be provided to cover the active surface 200a of the first die 200, and thus, the integrated circuit of the first die 200 may be protected from an external impact. In addition, the top surface of the first molding portion 310 and the top surface of the first bump BP1 of the first device layer DL1 may be flat and may be substantially coplanar with each other, and thus, the bonding process between the first device layer DL1 and the second redistribution substrate 400 may be easily performed. Furthermore, since the first bump BP1 of the first device layer DL1 and the second conductive pattern 420 of the second redistribution substrate 400 are connected to form a single body or structure, the first device layer DL1 and the second redistribution substrate 400 may be robustly bonded to each other. In other words, it may be possible to improve structural stability of the semiconductor package.

Figure 5:
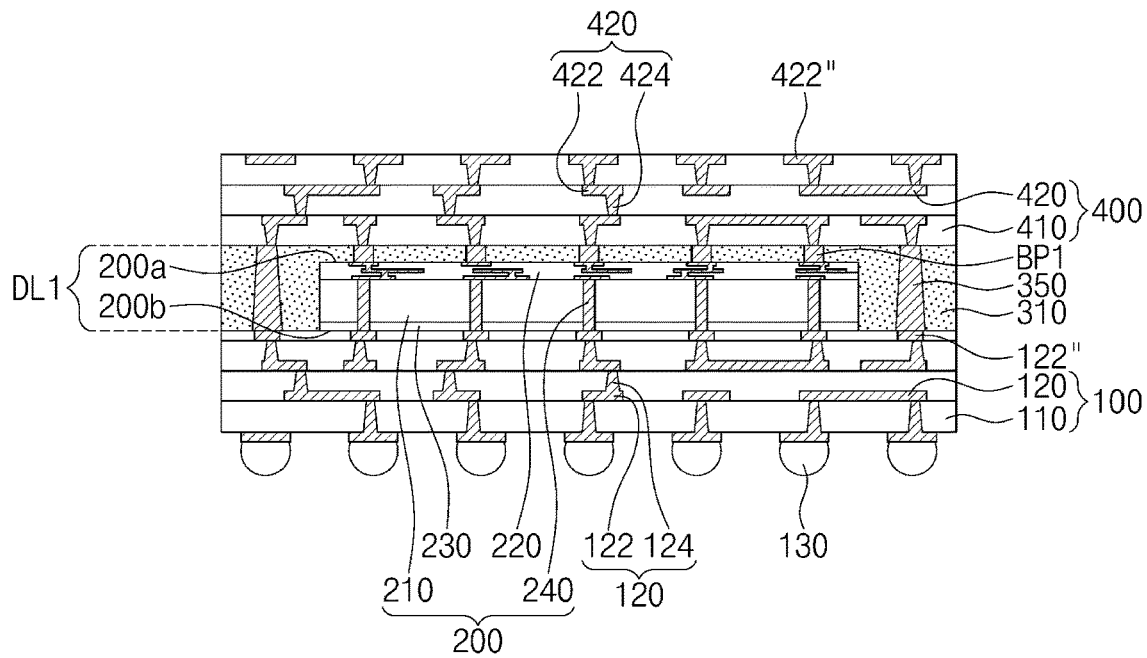
FIGS. 5 to 7 illustrate sectional views showing a semiconductor package, according to an embodiment.

In an embodiment, the second conductive pattern 420 of the second redistribution substrate 400 may have a 'T'-shaped section. FIG. 5 illustrates a sectional view showing a semiconductor package, according to an embodiment. For concise description, an element previously described with reference to FIGS. 1 to 4 may be identified by the same reference number without repeating an overlapping description thereof. That is, technical features, which are different from those in the embodiments of FIGS. 1 to 4, will be mainly described below.

Referring to FIG. 5, the second redistribution substrate 400 may be provided on the first molding portion 310. The second redistribution substrate 400 may include a plurality of second redistribution layers which are stacked.

Each of the second redistribution layers may include the second insulating pattern 410 and the second conductive pattern 420, which is provided in the second insulating pattern 410. The second conductive patterns 420 in adjacent ones of the second redistribution layers may be electrically connected to each other.

The second insulating pattern 410 may be formed of or include at least one of insulating polymers or photo-imageable polymers (PIDs).

The second conductive pattern 420 may be provided in the second insulating pattern 410. The second conductive pattern 420 may have a damascene structure. The second conductive pattern 420 may have a 'T'-shaped section. For example, the second conductive pattern 420 may include the head portion 422 and the tail portion 424, which are connected to form a single body or structure. The head portion 422 and the tail portion 424 may be vertically overlapped with each other, and the tail portion 424 may be extended from the head portion 422 toward the bottom surface of the second insulating pattern 410. The second conductive pattern 420 may have a bottom surface that is located at the same level as the bottom surface of the second insulating pattern 410. The head portion 422 of the second conductive pattern 420 in the uppermost second redistribution layer may be exposed to the outside of the second redistribution substrate 400 near the top surface of the second insulating pattern 410. The head portion 422 may be a pad, on which an additional semiconductor package or device can be mounted. The tail portion 424 in the lowermost second redistribution layer may be exposed to the outside of the second redistribution substrate 400 near the bottom surface of the second insulating pattern 410. The tail portion 424 may be a pad, to which the first bump BP1 is coupled. The tail portion 424 may have a bottom surface that is provided at the same level as the bottom surface of the second insulating pattern 410. The second conductive pattern 420 may be formed of or include at least one of conductive materials.

The second redistribution substrate 400 may be electrically connected to the first die 200 and the penetration electrode 350. For example, the first bump BP1 and the penetration electrode 350 may be coupled to the tail portion 424 in the second conductive pattern 420 of the lowermost second redistribution layer of the second redistribution substrate 400. The second conductive pattern 420 of the second redistribution substrate 400 may be bonded to the first bump BP1. Here, the second conductive pattern 420 or the tail portion 424 and the first bump BP1 may form the metal-metal hybrid bonding structure. For example, the second conductive pattern 420 or the tail portion 424 may be continuously connected to the first bump BP1, and there may be no observable interface between the second conductive pattern 420 or the tail portion 424 and the first bump BP1. In other words, the second conductive pattern 420 or the tail portion 424 and the first bump BP1 may be provided as a single body or structure. The second redistribution substrate 400 and the first die 200 may be electrically connected to each other through the second conductive pattern 420 or the tail portion 424 and the first bump BP1.

Figure 6:
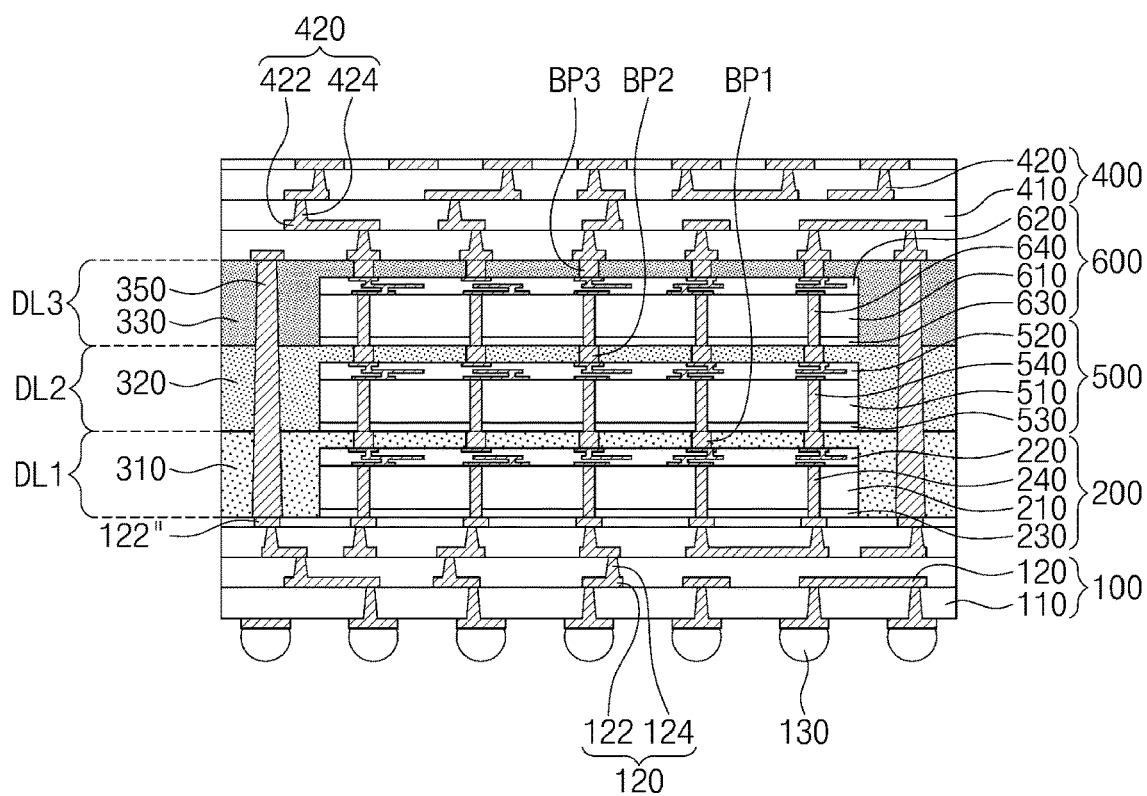

FIG. 6 illustrates a sectional view showing a semiconductor package, according to an embodiment.

Referring to FIG. 6, the semiconductor package may include a plurality of device layers. For example, the semiconductor package may include the first device layer DL1, a second device layer DL2, and a third device layer DL3, which are sequentially stacked on the first redistribution substrate 100. A semiconductor package including three device layers is illustrated in FIG. 6, but the inventive concept is not limited to this example. The semiconductor package may include two device layers or three or more device layers.

The second device layer DL2 may be provided on the first device layer DL1. The second device layer DL2 may have a structure that is substantially the same as or similar to the first device layer DL1. For example, the second device layer DL2 may include a second die 500, a second molding portion 320 surrounding the second die 500, and at least one second bump BP2 connected to the second die 500.

The second die 500 may be disposed on the top surface of the first device layer DL1. The second die 500 may be a memory chip, e.g., DRAM, SRAM, MRAM, or FLASH memory chips. Alternatively, the second die 500 may be a logic chip. The second die 500 may have a front surface and a rear surface. The front surface of the second die 500 may face in the direction of the second redistribution substrate 400. The second die 500 may be vertically aligned to the first die 200. For example, side surfaces of the second die 500 may be aligned to the side surfaces of the first die 200. However, the inventive concept is not limited to this example. The second die 500 may include a second base layer 510, a second circuit layer 520 and a second passivation layer 530. The second circuit layer 520 and the second passivation layer 530 are provided on opposite surfaces of the second base layer 510. The second die 500 may also include at least one second via 540, which is provided to penetrate the second base layer 510.

The second base layer 510 may be formed of or include silicon (Si). An integrated device or integrated circuits may be formed in an upper portion of the second base layer 510.

The second circuit layer 520 may be provided on a top surface of the second base layer 510. The second circuit layer 520 may be electrically connected to an integrated device or integrated circuits, which are formed in the second base layer 510. For example, the second circuit layer 520 may include an insulating pattern and a circuit pattern, which is provided in the insulating pattern and is coupled to the integrated device or integrated circuits formed in the second base layer 510. A portion of the circuit pattern may be exposed to the outside of the second circuit layer 520 near a top surface of the second circuit layer 520, and may be used as a pad of the second die 500.

The second passivation layer 530 may be provided on a bottom surface of the second base layer 510. The second passivation layer 530 may be formed of or include at least one of insulating materials.

The second via 540 may be provided to vertically penetrate the second base layer 510 and the second passivation layer 530. An end portion of the second via 540 may be exposed to the outside of the second die 500, near the bottom surface of the second passivation layer 530. Here, the second via 540 may have a bottom surface that is substantially coplanar with the bottom surface of the second passivation layer 530, and the bottom surfaces of the second via 540 and the second passivation layer 530 may be substantially flat. An opposite end of the second via 540 may be extended toward the front surface of the second die 500 and may be coupled to the second circuit layer 520.

The second die 500 may be mounted on the first die 200. For example, the second passivation layer 530 of the second die 500 may be in contact with the top surface of the first molding portion 310 of the first device layer DL1. Here, the second via 540 in the second die 500 may be coupled to the first bump BP1. Here, the second via 540 and the first bump BP1 may form the metal-metal hybrid bonding structure. For example, the second via 540 may be continuously connected to the first bump BP1, and there may be no observable interface between the second via 540 and the first bump BP1. In other words, the second via 540 and the first bump BP1 may be provided as a single body or structure. The second die 500 and the first die 200 may be electrically connected to each other through the second via 540 and the first bump BP1.

The second molding portion 320 may be provided on the first device layer DL1. The second molding portion 320 may cover at least a portion of the top surface of the first device layer DL1. The second molding portion 320 may be provided to surround the second die 500, when viewed in a plan view. The second molding portion 320 may cover side surfaces of the second die 500 and may cover the top surface of the second die 500. Here, the second molding portion 320 may be provided to enclose the second bump BP2 and to expose a top surface of the second bump BP2. A top surface of the second molding portion 320 may be substantially coplanar with the top surface of the second bump BP2. A bottom surface of the second molding portion 320 may be substantially coplanar with the bottom surface of the second die 500. The second molding portion 320 may be formed of or include at least one of insulating materials (e.g., an epoxy molding compound (EMC)). An interface between the first molding portion 310 and the second molding portion 320 may be located on the same plane as an interface between the first bump BP1 and the second die 500.

The third device layer DL3 may be provided on the second device layer DL2. The third device layer DL3 may have a structure that is substantially the same as or similar to the first device layer DL1. For example, the third device layer DL3 may include a third die 600, a third molding portion 330 surrounding the third die 600, and at least one third bump BP3 connected to the third die 600.

The third die 600 may be disposed on the top surface of the second device layer DL2. The third die 600 may be a memory chip, e.g., DRAM, SRAM, MRAM, or FLASH memory chips. Alternatively, the third die 600 may be a logic chip. The third die 600 may have a front surface and a rear surface. The front surface of the third die 600 may face in the direction of the second redistribution substrate 400. The third die 600 may be vertically aligned to the first die 200 and the second die 500. For example, side surfaces of the third die 600 may be aligned to the side surfaces of the first and second dies 200 and 500. But the inventive concept is not limited to this example. The third die 600 may include a third base layer 610, a third circuit layer 620 and a third passivation layer 630. The third circuit layer 620 and the third passivation layer 630 are provided on opposite surfaces of the third base layer 610. The third die 600 may also include at least one third via 640, which is provided to penetrate the third base layer 610.

The third base layer 610 may be formed of or include silicon (Si). In an embodiment, an integrated device or integrated circuits may be formed in an upper portion of the third base layer 610.

The third circuit layer 620 may be provided on a top surface of the third base layer 610. The third circuit layer 620 may be electrically connected to an integrated device or integrated circuits, which are formed in the third base layer 610. For example, the third circuit layer 620 may have an insulating pattern and a circuit pattern, which is provided in the insulating pattern and is coupled to the integrated device or the integrated circuits in the third base layer 610. A portion of the circuit pattern may be exposed to the outside of the third circuit layer 620 near a top surface of the third circuit layer 620, and may be used as a pad of the third die 600.

The third passivation layer 630 may be provided on a bottom surface of the third base layer 610. The third passivation layer 630 may be formed of or include at least one of insulating materials.

The third via 640 may be provided to vertically penetrate the third base layer 610 and the third passivation layer 630. An end portion of the third via 640 may be exposed near a bottom surface of the third passivation layer 630. Here, a bottom surface of the third via 640 may be substantially coplanar with the bottom surface of the third passivation layer 630, and the bottom surfaces of the third via 640 and the third passivation layer 630 may be substantially flat. An opposite end of the third via 640 may be extended toward the front surface of the third die 600 and may be coupled to the third circuit layer 620.

The third die 600 may be mounted on the second die 500. For example, the third passivation layer 630 of the third die 600 may be in contact with the top surface of the second molding portion 320 of the second device layer DL2. Here, the third via 640 in the third die 600 may be coupled to the second bump BP2. Here, the third via 640 and the second bump BP2 may form the metal-metal hybrid bonding structure. For example, the third via 640 may be continuously connected to the second bump BP2, and there may be no observable interface between the third via 640 and the second bump BP2. In other words, the third via 640 and the second bump BP2 may be provided as a single body or structure. The third die 600 and the second die 500 may be electrically connected to each other through the third via 640 and the second bump BP2.

The third molding portion 330 may be provided on the second device layer DL2. The third molding portion 330 may cover at least a portion of the top surface of the second device layer DL2. The third molding portion 330 may be provided to surround the third die 600, when viewed in a plan view. The third molding portion 330 may cover side surfaces of the third die 600 and may cover a top surface of the third die 600. Here, the third molding portion 330 may be provided to enclose the third bump BP3 and to expose a top surface of the third bump BP3. The third molding portion 330 may have a top surface that is substantially coplanar with the top surface of the third bump BP3. The third molding portion 330 may have a bottom surface that is substantially coplanar with the bottom surface of the third die 600. The third molding portion 330 may be formed of or include at least one of insulating materials (e.g., an epoxy molding compound (EMC)). An interface between the second molding portion 320 and the third molding portion 330 may be located on the same plane as an interface between the second bump BP2 and the third die 600.

The penetration electrode 350 may be provided on the first redistribution substrate 100. The penetration electrode 350 may be disposed in a region around the first die 200, the second die 500, and the third die 600. The penetration electrode 350 may be provided to vertically penetrate the first molding portion 310, the second molding portion 320, and the third molding portion 330. An end portion of the penetration electrode 350 may be extended toward the first redistribution substrate 100 and may be coupled to the first conductive pattern 120 of the first redistribution substrate 100. The bottom surface of the penetration electrode 350 may be substantially coplanar with the bottom surface of the first molding portion 310 and the bottom surface of the first passivation layer 230 of the first die 200. An opposite end of the penetration electrode 350 may be exposed to the outside of the third molding portion 330 near the top surface of the third molding portion 330. The top surface of the penetration electrode 350 may be substantially coplanar with the top surface of the third molding portion 330 and the top surface of the third bump BP3. A width of the penetration electrode 350 may decrease in an upward direction from the first redistribution substrate 100. Alternatively, the width of the penetration electrode 350 may be substantially constant throughout its height from its bottom surface.

The second redistribution substrate 400 may be provided on the third molding portion 330. The second redistribution substrate 400 may be in contact with the top surface of the third molding portion 330 and the top surface of the third bump BP3. The second redistribution substrate 400 may include a plurality of second redistribution layers which are stacked.

The second redistribution substrate 400 may be electrically connected to the third die 600 and the penetration electrode 350. For example, the third bump BP3 and the penetration electrode 350 may be coupled to the second conductive pattern 420 in the lowermost second redistribution layer of the second redistribution substrate 400. The second conductive pattern 420 and the third bump BP3 may be bonded to each other. Here, the second conductive pattern 420 and the third bump BP3 may form the metal-metal hybrid bonding structure. For example, the second conductive pattern 420 may be continuously connected to the third bump BP3, and there may be no observable interface between the second conductive pattern 420 and the third bump BP3. In other words, the second conductive pattern 420 and the third bump BP3 may be provided as a single body or structure. The second redistribution substrate 400 and the third die 600 may be electrically connected to each other through the second conductive pattern 420 and the third bump BP3.

Figure 7:
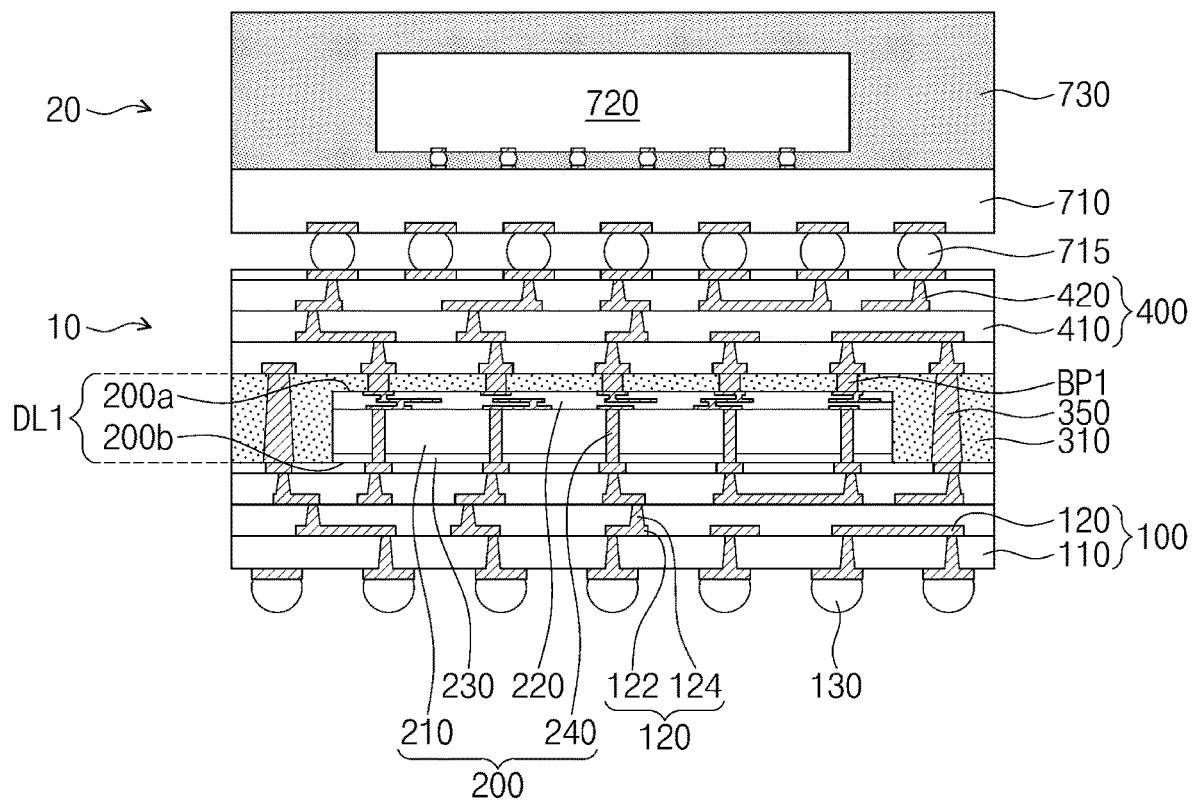

FIG. 7 illustrates a sectional view showing a semiconductor package, according to an embodiment.

Referring to FIG. 7, an upper package 20 may be provided on the semiconductor package 10 of FIG. 1. The upper package 20 may include an upper package substrate 710, an upper die 720, and an upper molding portion 730.

The upper package substrate 710 may be disposed on the second redistribution substrate 400. Here, the upper package substrate 710 may be vertically spaced apart from the second redistribution substrate 400. The upper package substrate 710 may be a printed circuit board (PCB) with signal patterns. In an embodiment, the upper package substrate 710 may have a structure, in which insulating layers and interconnection layers are alternatively stacked.

The upper package substrate 710 may be mounted on the second redistribution substrate 400. For example, substrate terminals 715 may be disposed below the upper package substrate 710. The substrate terminals 715 may be coupled to the second conductive pattern 420 of the second redistribution substrate 400. The substrate terminals 715 may include solder balls or solder bumps.

At least one upper die 720 may be disposed on the upper package substrate 710. Where there are two or more upper dies 720 are disposed on the upper package substrate 710, the upper dies 720 may be spaced apart from each other, when viewed in a plan view. The upper dies 720 may be mounted on a top surface of the upper package substrate 710. For example, the upper dies 720 may be mounted on the upper package substrate 710 in a flip-chip bonding manner. In other words, the upper dies 720 may be electrically connected to the upper package substrate 710 through upper die terminals (e.g., solder balls or solder bumps). However, the inventive concept is not limited to this example, and in an embodiment, the upper dies 720 may be mounted on the upper package substrate 710 by various connection means (e.g., bonding wires). Each of the upper dies 720 may be, for example, a logic chip or a memory chip. The upper dies 720 may be electrically connected to the outer terminals 130 of the first redistribution substrate 100 and the first die 200 through the upper package substrate 710 and the second redistribution substrate 400. The number of the upper dies 720 disposed on the upper package substrate 710 may be variously changed.

The upper molding portion 730 may be provided on the upper package substrate 710. The upper molding portion 730 may be provided on the top surface of the upper package substrate 710 to surround the upper dies 720. For example, the upper molding portion 730 may be provided to encapsulate the upper dies 720 on the upper package substrate 710.

FIGS. 8 to 19 illustrate sectional views showing a method of manufacturing a semiconductor package, according to embodiments.

Figure 8:
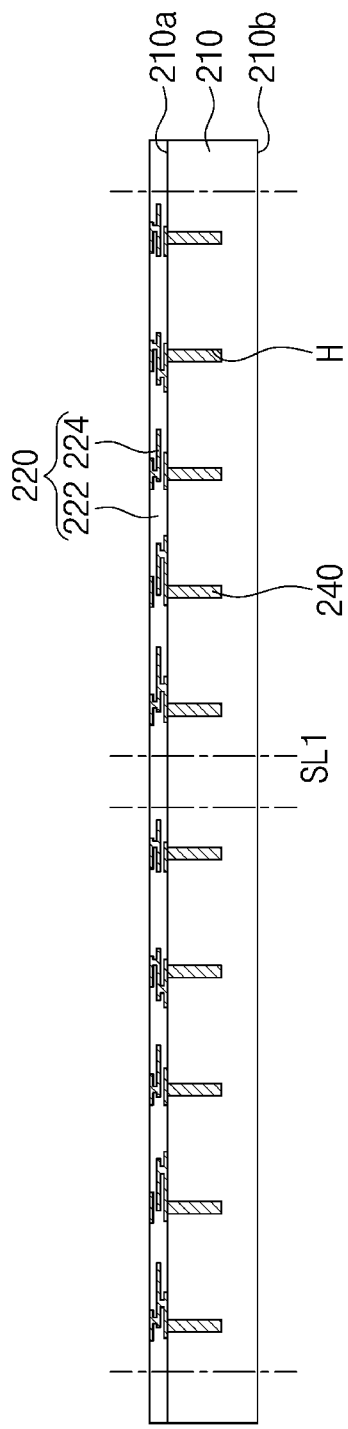

Referring to FIG. 8, the first base layer 210 may be provided. As an example, the first base layer 210 may include a semiconductor wafer. For example, the first base layer 210 may be a silicon wafer. The first base layer 210 may have a first surface 210a and a second surface 210b, which are opposite to each other. An integrated circuit may be formed on the first surface 210a of the first base layer 210.

Holes H may be formed in the first base layer 210. The holes H may be formed by performing a laser drilling process or the like on the first surface 210a of the first base layer 210. Alternatively, the holes H may be formed by forming a mask pattern on the first surface 210a of the first base layer 210 and performing an anisotropic etching process using the mask pattern as an etch mask. The holes H may not penetrate the first base layer 210 vertically. In other words, the holes H may be formed to be spaced apart from the second surface 210b of the first base layer 210.

The first vias 240 may be formed in the first base layer 210. For example, the formation of the first vias 240 may include forming or depositing a conductive material on the first surface 210a of the first base layer 210. Here, the conductive material may be formed to fill the holes H of the first base layer 210. Next, a portion of the conductive material, which is located on the first surface 210a of the first base layer 210, may be removed to leave the conductive material within only the holes H.

The first circuit layer 220 may be formed on the first surface 210a of the first base layer 210. For example, an insulating layer (e.g., silicon oxide (SiO)) may be formed on the first surface 210a of the first base layer 210, and then, the insulating layer may be patterned to form a portion of the insulating pattern 222. The insulating pattern 222 may be formed to expose the first vias 240. A conductive layer may be formed on a top surface of the insulating pattern 222, and then, the conductive layer may be patterned to form the circuit pattern 224. The circuit patterns 224 may be electrically connected to the first vias 240. The first circuit layer 220 may be formed by repeating the process of forming and patterning the insulating and conductive layers.

Figure 9:
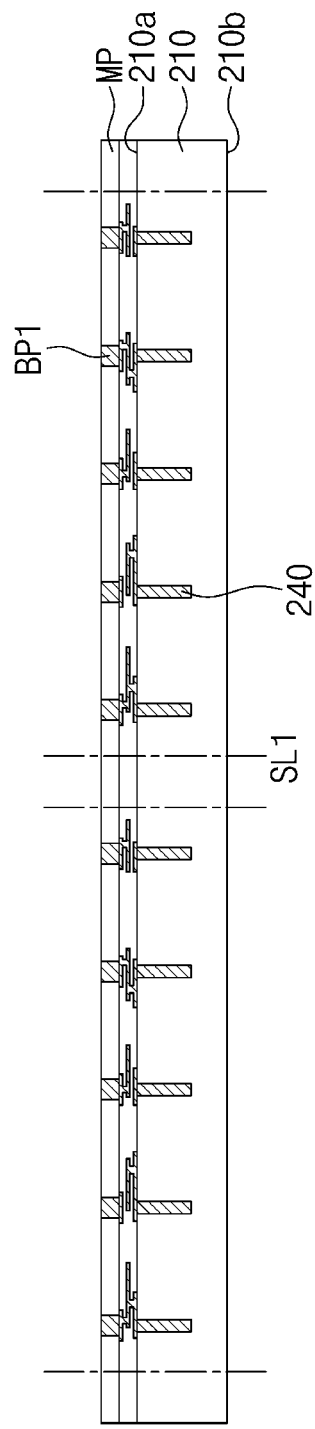

Referring to FIG. 9, the first bumps BP1 may be formed on the first circuit layer 220. For example, a mask pattern MP may be formed on the first circuit layer 220. The mask pattern MP may have openings, which are formed to expose the circuit pattern 224 of the first circuit layer 220. Thereafter, the first bumps BP1 may be formed by conformally forming a seed layer (e.g., see BP1s of FIG. 3) or a barrier layer in the openings and performing an electroplating process, in which the seed or barrier layer is used as a seed, to fill the openings with a metallic material. It is understood here, the terms "seed layer" and "barrier layer" are interchangeably used throughout the embodiments disclosed herein.

Thereafter, the mask pattern MP may be removed.

Referring to FIG. 10, a first carrier substrate 910 may be provided. The first carrier substrate 910 may be an insulating substrate, which is formed of or includes glass or polymer, or a conductive substrate, which is formed of or includes at least one of metallic materials. A first adhesive member 912 may be provided on a top surface of the first carrier substrate 910. As an example, the first adhesive member 912 may include an adhesive tape.

The first circuit layer 220 may be attached to the top surface of the first carrier substrate 910. For example, a surface of the first circuit layer 220 may be attached to the first adhesive member 912. Here, the first bumps BP1 may be inserted into the first adhesive member 912.

Next, a portion of the first base layer 210 may be removed. In detail, the first base layer 210 may be thinned to expose the first vias 240. For example, a chemical mechanical polishing process (CMP) or a grinding process may be performed on the second surface 210b of the first base layer 210. A third surface 210c of the first base layer 210, which is formed by the thinning process, may be located at a level lower than end portions of the first vias 240. In other words, portions of the first vias 240 may protrude above the third surface 210c of the first base layer 210. Alternatively, the third surface 210c of the first base layer 210, which is formed by the thinning process, may be substantially coplanar with the end portions of the first vias 240. For example, the third surface 210c of the first base layer 210 and the end portions of the first vias 240 may be formed to define a substantially flat surface.

Referring to FIG. 11, the first passivation layer 230 may be formed on the third surface 210c of the first base layer 210. For example, the first passivation layer 230 may be formed by depositing an insulating material (e.g., silicon oxide or silicon nitride) on the third surface 210c of the first base layer 210. Here, the first passivation layer 230 may conformally cover the third surface 210c of the first base layer 210 and the protruding portions of the first vias 240. In the case where the first vias 240 do not protrude above the third surface 210c of the first base layer 210, an oxidation or nitridation process may be performed on the exposed third surface 210c of the first base layer 210, and in this case, a portion of the first base layer 210 adjacent to the third surface 210c may be oxidized or nitridated to form the first passivation layer 230.

Next, a singulation process may be performed on the structure of FIG. 11. For example, the first circuit layer 220, the first base layer 210, and the first passivation layer 230 may be cut to form a plurality of first dies 200 that are separated from each other. In other words, the singulation process may be performed along a first sawing line SL1 to form the first dies 200 that are separated from each other.

The first carrier substrate 910 may be removed, after the singulation process. For example, the first adhesive member 912 may be dissolved to detach or physically remove the first carrier substrate 910 from the structure of FIG. 11.

Figure 12:
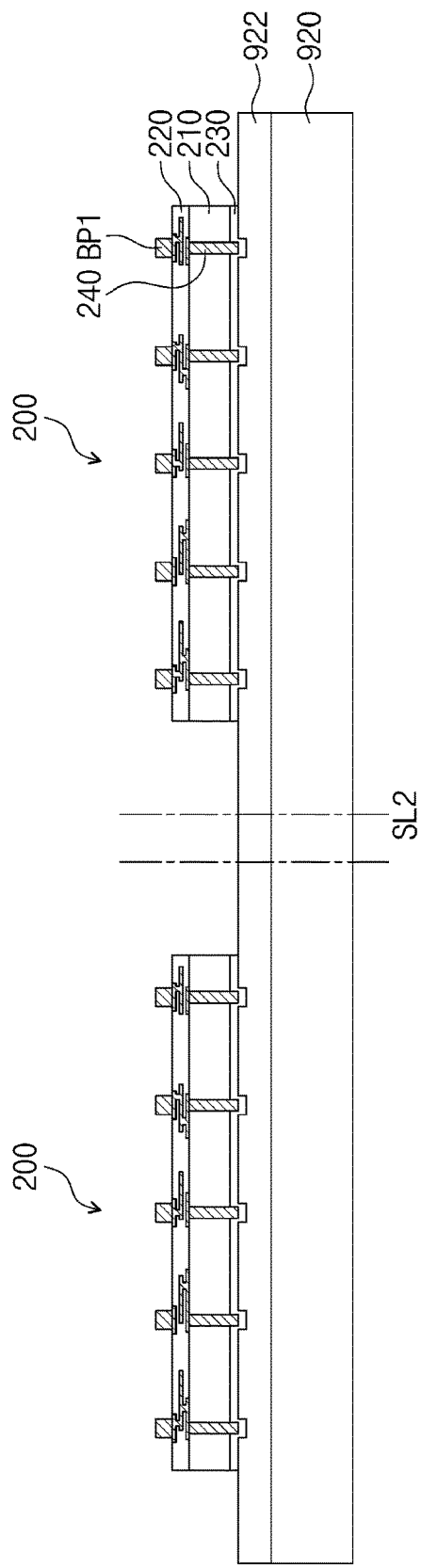

Referring to FIG. 12, a second carrier substrate 920 may be provided. The second carrier substrate 920 may be an insulating substrate including glass or polymer or a conductive substrate including a metallic material. A second adhesive member 922 may be provided on a top surface of the second carrier substrate 920. As an example, the second adhesive member 922 may include an adhesive tape.

The first dies 200 may be attached to the second carrier substrate 920. For example, a surface of the first passivation layer 230 may be attached to the second adhesive member 922. In an embodiment, the first vias 240 and the first passivation layer 230 covering the first vias 240 may be partially inserted into the second adhesive member 922.

Figure 13:
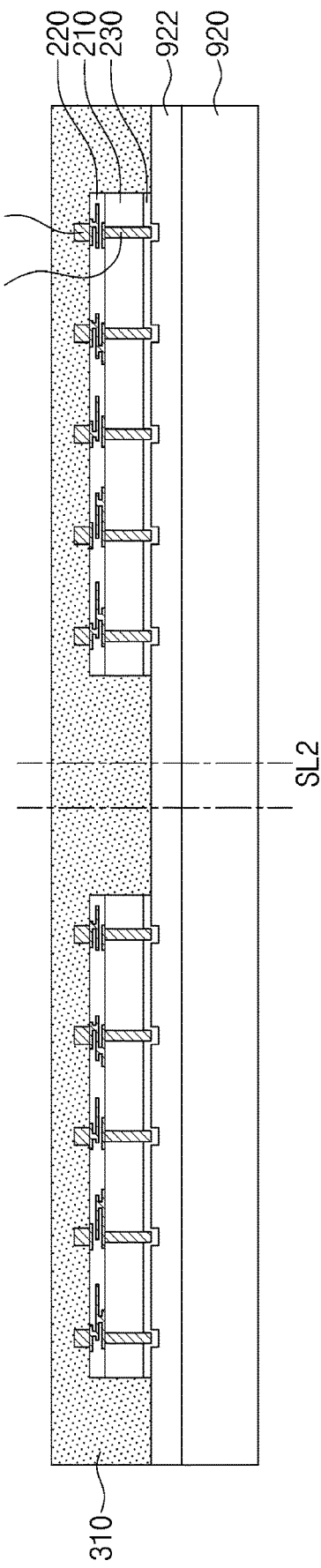

Referring to FIG. 13, the first molding portion 310 may be formed on the second carrier substrate 920. For example, an insulating material may be formed on the top surface of the second carrier substrate 920 to encapsulate the first dies 200, and then, the insulating material may be cured to form the first molding portion 310. The first molding portion 310 may be formed to cover side and top surfaces of the first dies 200 and side and top surfaces of the first bumps BP1.

Figure 14:
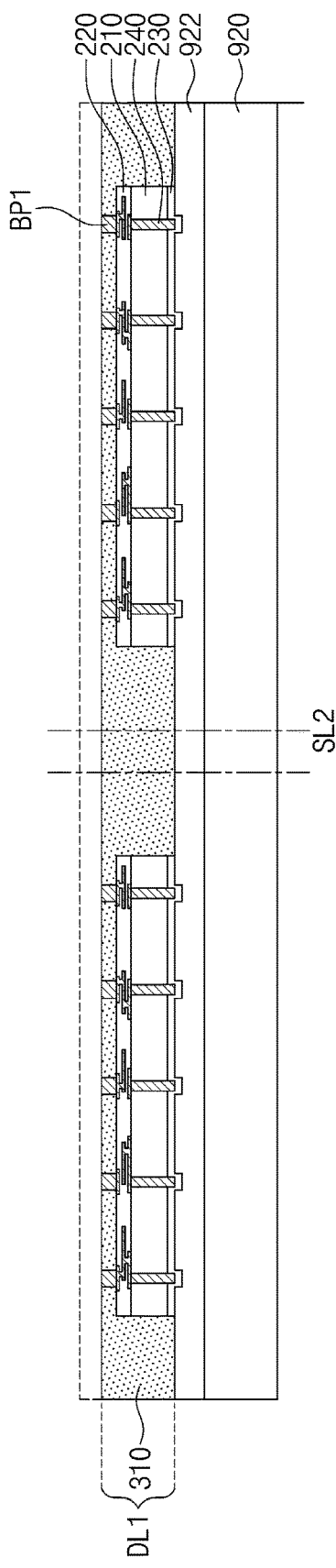

Referring to FIG. 14, a portion of the first molding portion 310 may be removed. In detail, the first molding portion 310 may be thinned. For example, a grinding process or a chemical mechanical polishing (CMP) process may be performed on the top surface of the first molding portion 310. Accordingly, the first molding portion 310 may have a flat top surface. The thinning process may be performed until the top surfaces of the first bumps BP1 are exposed. In an embodiment, an upper portion of the first molding portion 310 may be removed by the thinning process, and in certain cases, upper portions of the first bumps BP1 may also be removed during the thinning process.

After the thinning process, the first bumps BP1 may be exposed to the outside near the top surface of the first molding portion 310. The top surfaces of the first bumps BP1 and the top surface of the first molding portion 310 may be substantially flat and may be substantially coplanar with each other.

One first die 200 and the first bumps BP1 and the first molding portion 310, which are disposed on the one first die 200, may constitute the first device layer DL1 described with reference to FIG. 1.

Figure 15:
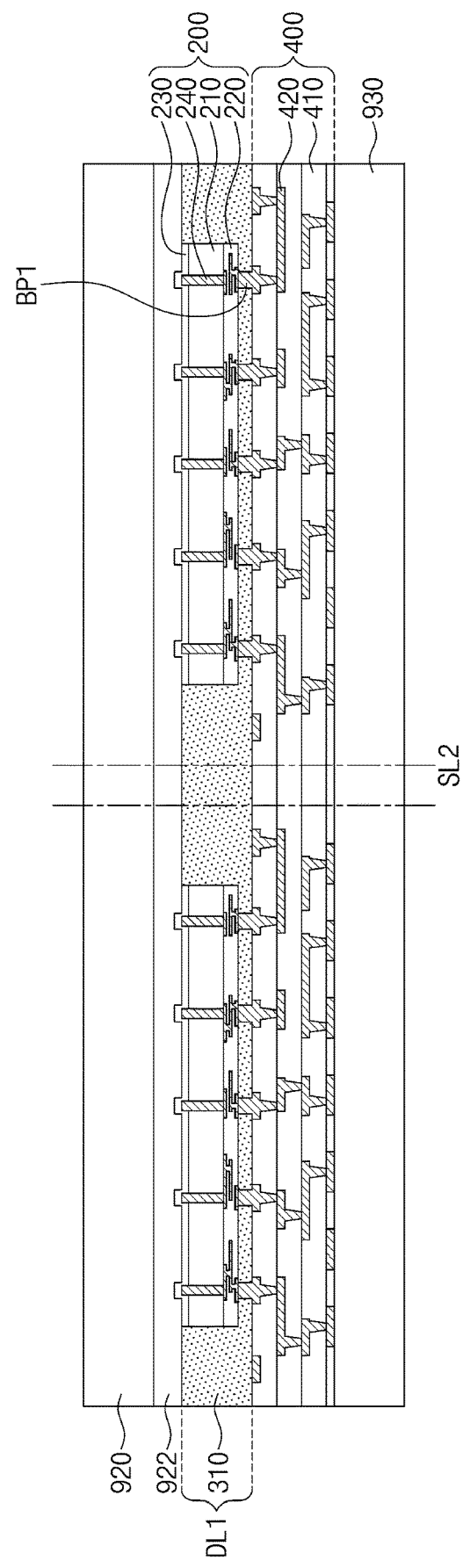

Referring to FIG. 15, the second redistribution substrate 400 may be formed. In detail, a third carrier substrate 930 may be provided. The second insulating pattern 410 may be formed on the third carrier substrate 930. The second insulating pattern 410 may be formed of or include at least one of insulating polymers or photo-imageable polymers (PIDs). The second conductive pattern 420 may be formed in the second insulating pattern 410. For example, the formation of the second conductive pattern 420 may include patterning the second insulating pattern 410 to form openings for the second conductive pattern 420, conformally forming a seed layer in the openings, and performing an electroplating process, in which the seed layer is used as a seed, to fill the openings with a plating layer. A redistribution layer may be formed by the afore-described method.

The second insulating pattern 410 may be additionally formed on the redistribution layer, which is formed by the afore-described method. The second insulating pattern 410 may be formed by a coating process (e.g., a spin coating process or a slit coating process). The second insulating pattern 410 may be formed of or include at least one of photo-imageable polymers (PIDs). The second insulating pattern 410 may have a first opening, which exposes the second conductive pattern 420 of the redistribution layer therebelow, and a second opening, which is provided on the first opening and has a width larger than the first opening. Thereafter, the second conductive patterns 420 may be formed by conformally forming a seed layer in the first opening and the second opening and performing an electroplating process, in which the seed layer is used as a seed, to fill the first and second openings with a plating layer. Redistribution layers may be additionally formed on the redistribution layer through the afore-described method.

So far, one example method of forming the second redistribution substrate 400 has been described, but the inventive concept is not limited to this example.

Referring further to FIG. 15, the second carrier substrate 920 may be disposed above the third carrier substrate 930. Here, the second redistribution substrate 400 and the first device layer DL1 may be placed to face each other.

The first device layer DL1 may be bonded to the second redistribution substrate 400. For example, the third carrier substrate 930 and the second carrier substrate 920 may move toward each other such that the first molding portion 310 of the first device layer DL1 is in contact with the second redistribution substrate 400. For example, the first bumps BP1, which are exposed to the outside near a surface of the first molding portion 310, may be in contact with the second conductive pattern 420 of the second redistribution substrate 400. The first molding portion 310 may be in contact with the second insulating pattern 410 of the second redistribution substrate 400.

The first bumps BP1 and the second conductive pattern 420 may be bonded to form a single body or structure. The bonding of the first bumps BP1 and the second conductive pattern 420 may be naturally performed. For example, the first bumps BP1 and the second conductive pattern 420 may be formed of the same material (e.g., copper (Cu)), and in this case, the first bumps BP1 and the second conductive pattern 420 may be bonded to each other through a metal-metal (e.g., copper-copper) hybrid bonding process, which is caused by surface activation at an interface between the first bumps BP1 and the second conductive pattern 420 in contact with each other. Since the first bumps BP1 and the second conductive pattern 420 are bonded to each other, the interface between the first bumps BP1 and the second conductive pattern 420 may disappear. Since the first bumps BP1 and the second conductive pattern 420 form the single body or structure, the first dies 200 may be robustly combined to the second redistribution substrate 400.

In an embodiment, to facilitate the bonding of the first bumps BP1 and the second conductive pattern 420, a surface activation process may be performed on surfaces of the first bumps BP1 and the second conductive pattern 420. The surface activation process may include a plasma process. In addition, to facilitate the bonding of the first bumps BP1 and the second conductive pattern 420, pressure and heat may be applied to the first bumps BP1 and the second conductive pattern 420. For example, the first bumps BP1 and the second conductive pattern 420 may be treated by an annealing process, which is performed at a temperature of about 100° C. to 500° C. under the pressure lower than about 30 MPa. However, the inventive concept is not limited to this example, and the pressure and temperature conditions for the hybrid bonding process may be variously changed.

In a case where the first bumps BP1 are not provided, the first dies may have different heights from each other, due to a process variation in the process of forming the first dies, and in this case, the first die of a small height may be spaced apart from the second redistribution substrate. Accordingly, the first dies of a small height may for a short circuit with the second redistribution substrate, which results in a failure of a semiconductor package.

However, according to an embodiment, the first bumps BP1, which are coupled to the first circuit layer 220 of the first die 200, may be provided on the first die 200. The first bumps BP1 may compensate the difference in height between the first dies 200, and due to the presence of the first bumps BP1, the first die 200 may be reliably coupled to the second redistribution substrate 400. In addition, since the first bumps BP1 has a sufficiently large thickness, a planarization process may be easily performed on the top surfaces of the first bumps BP1. Accordingly, the hybrid bonding process of the first device layer DL1 and the second redistribution substrate 400 may be easily performed, and the semiconductor package may be manufactured in a robust structure.

Referring to FIG. 16, the second carrier substrate 920 may be removed. For example, the second adhesive member 922 may be dissolved to detach or physically remove the second carrier substrate 920 from the structure of FIG. 15. Since the second carrier substrate 920 is removed, the first molding portion 310 and the first passivation layer 230 of the first die 200 may be exposed to the outside.

At least one penetration electrode hole 352 may be formed in the first molding portion 310. The penetration electrode hole 352 may be formed in a region around the first die 200, when viewed in a plan view. The penetration electrode hole 352 may be provided to vertically penetrate the first molding portion 310 and to expose the second conductive pattern 420 of the second redistribution substrate 400. The penetration electrode hole 352 may be formed to have a width that decreases in a direction toward the second redistribution substrate 400.

Referring to FIG. 17, the penetration electrode 350 may be formed. The penetration electrode 350 may be formed by filling the penetration electrode hole 352 with a metallic material. For example, a seed layer may be formed on the first molding portion 310. The seed layer may conformally cover the top surface of the first molding portion 310 and an inner side surface of the penetration electrode hole 352. Thereafter, an electroplating process using the seed layer as a seed may be performed to fill the penetration electrode hole 352 with the metallic material.

Next, a planarization process may be performed on the first molding portion 310. Accordingly, the penetration electrode 350, the first molding portion 310, the first passivation layer 230, and the first via 240 may be formed to have top surfaces that are substantially coplanar with each other and are substantially flat.

Figure 18:
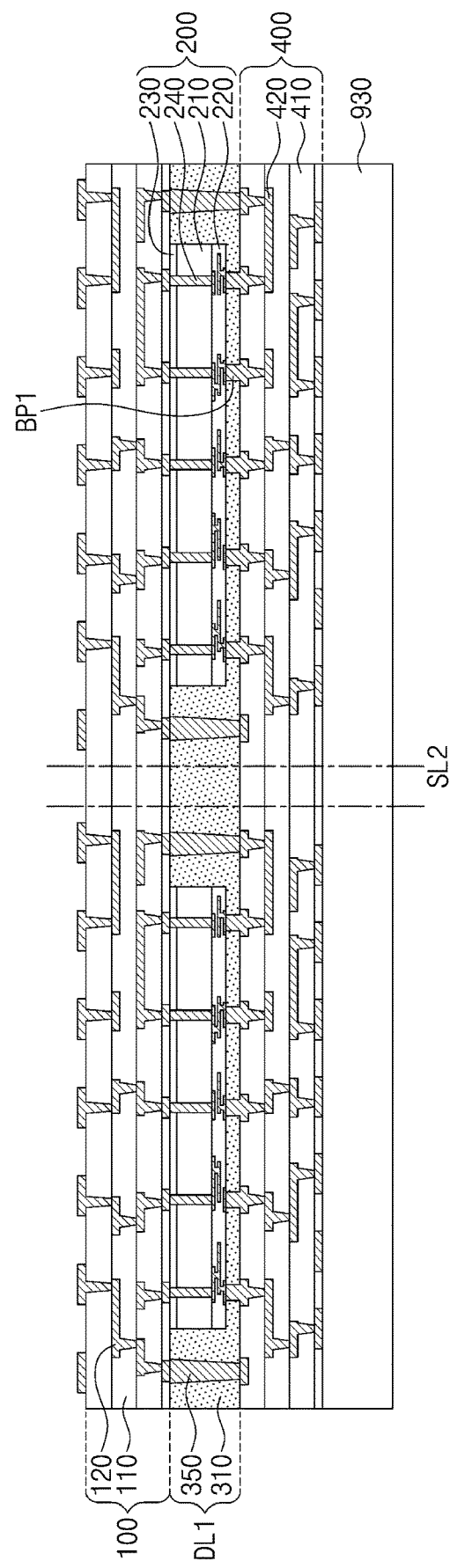

Referring to FIG. 18, the first redistribution substrate 100 may be formed on the first device layer DL1. In detail, the first insulating pattern 110 may be formed on the first device layer DL1. The first insulating pattern 110 may be formed of or include at least one of insulating polymers or photo-imageable polymers (PIDs). The first conductive pattern 120 may be formed in the first insulating pattern 110. For example, the formation of the first conductive pattern 120 may include patterning the first insulating pattern 110 to form openings for the first conductive patterns 120, conformally forming a seed layer in the openings, and performing an electroplating process, in which the seed layer is used as a seed, to fill the openings with a plating layer. The openings may be formed to expose the penetration electrode 350 and the first via 240 of the first device layer DL1. Accordingly, the first conductive pattern 120 may be coupled to the penetration electrode 350 and the first via 240. A redistribution layer may be formed by the afore-described method.

The first insulating pattern 110 may be additionally formed on the redistribution layer, which is formed by the afore-described method. The first insulating pattern 110 may be formed by a coating process (e.g., a spin coating process or a slit coating process). The first insulating pattern 110 may be formed of or include at least one of photo-imageable polymers (PIDs). The first insulating pattern 110 may have a first opening, which exposes the first conductive pattern 120 of the redistribution layer therebelow, and a second opening, which is provided on the first opening and has a width larger than the first opening. Thereafter, the first conductive pattern 120 may be formed by conformally forming a seed layer in the first opening and the second opening and performing an electroplating process, in which the seed layer is used as a seed, to fill the first and second openings with a plating layer. Redistribution layers may be additionally formed on the redistribution layer through the afore-described method.

So far, one example method of forming the first redistribution substrate 100 has been described, but the inventive concept is not limited to this example.

Figure 19:
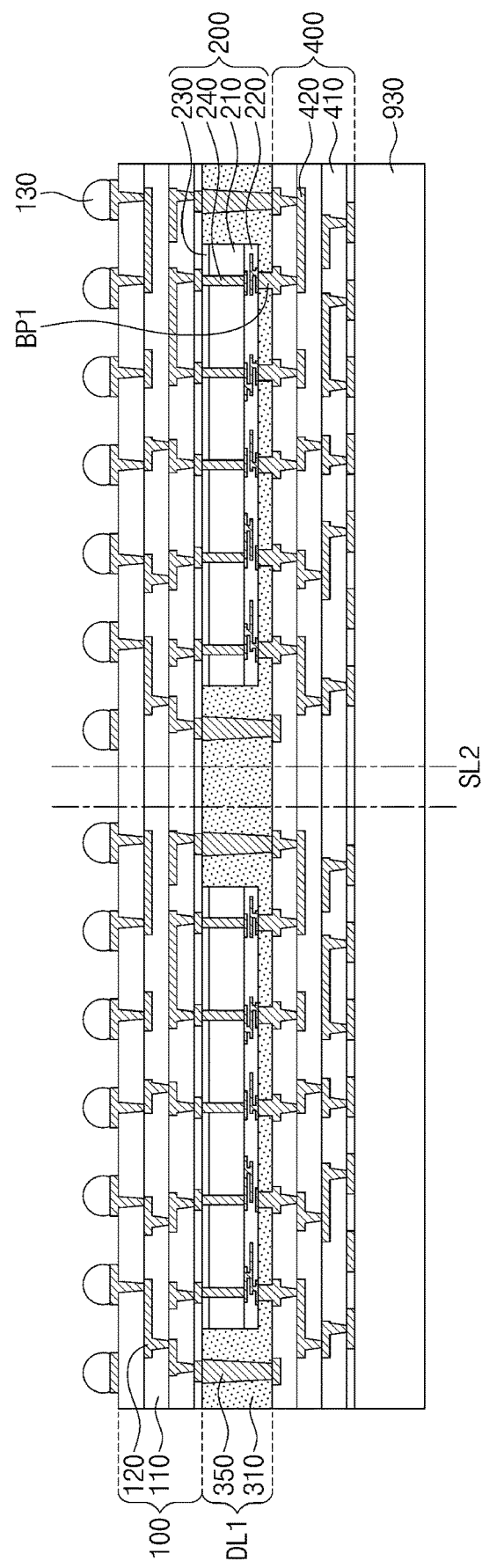

Referring to FIG. 19, the outer terminals 130 may be provided on the first redistribution substrate 100. The outer terminals 130 may be formed on the first conductive patterns 120, which are exposed to the outside of the first redistribution substrate 100 near the top surface of the first redistribution substrate 100.

Thereafter, a singulation process may be performed on the structure of FIG. 19. For example, the first redistribution substrate 100, the first molding portion 310 and the second redistribution substrate 400 may be cut to form semiconductor packages, which are separated from each other. In an embodiment, the first redistribution substrate 100, the first molding portion 310, and the second redistribution substrate 400 may be sawn along a second sawing line SL2 to form a plurality of semiconductor packages, which are separated from each other.

The third carrier substrate 930 may be removed after the singulation process. The semiconductor package of FIG. 1 may be manufactured through the afore-described method.

FIGS. 20 to 26 illustrate sectional views showing a method of manufacturing a semiconductor package, according to embodiments.

Figure 20:
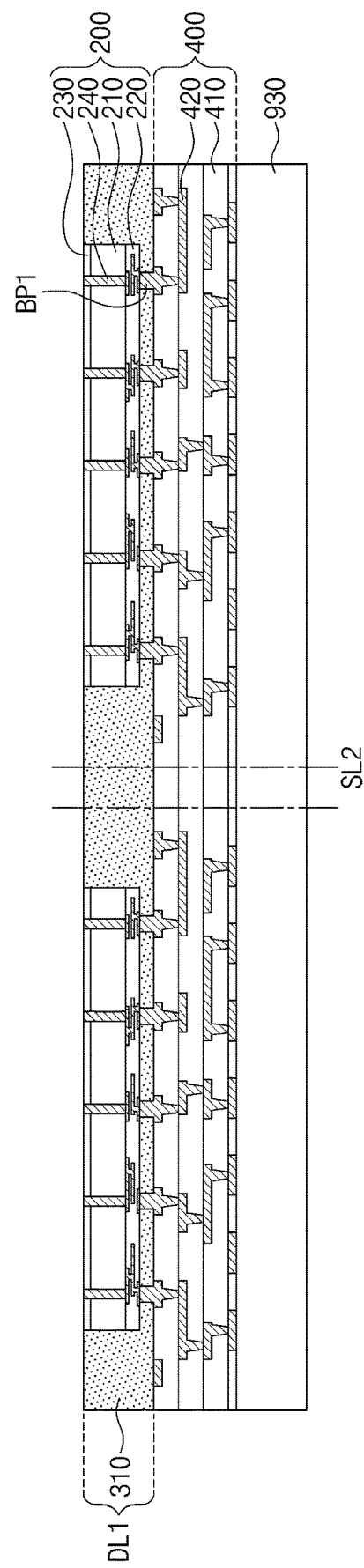

Referring to FIG. 20, the second carrier substrate 920 may be removed from the structure of FIG. 15. For example, the second adhesive member 922 may be dissolved to detach or physically remove the second carrier substrate 920 from the structure of FIG. 15. The first device layer DL1 in FIG. 21 may correspond to the third device layer DL3 described with reference to FIG. 6.

As a result of the second carrier substrate 920, the top surface of the first device layer DL1 may be exposed. For example, the top surface of the first molding portion 310 and the top surface of the first die 200 may be exposed. In detail, the top surfaces of the first passivation layer 230 and the first via 240 may be exposed.

Figure 21:
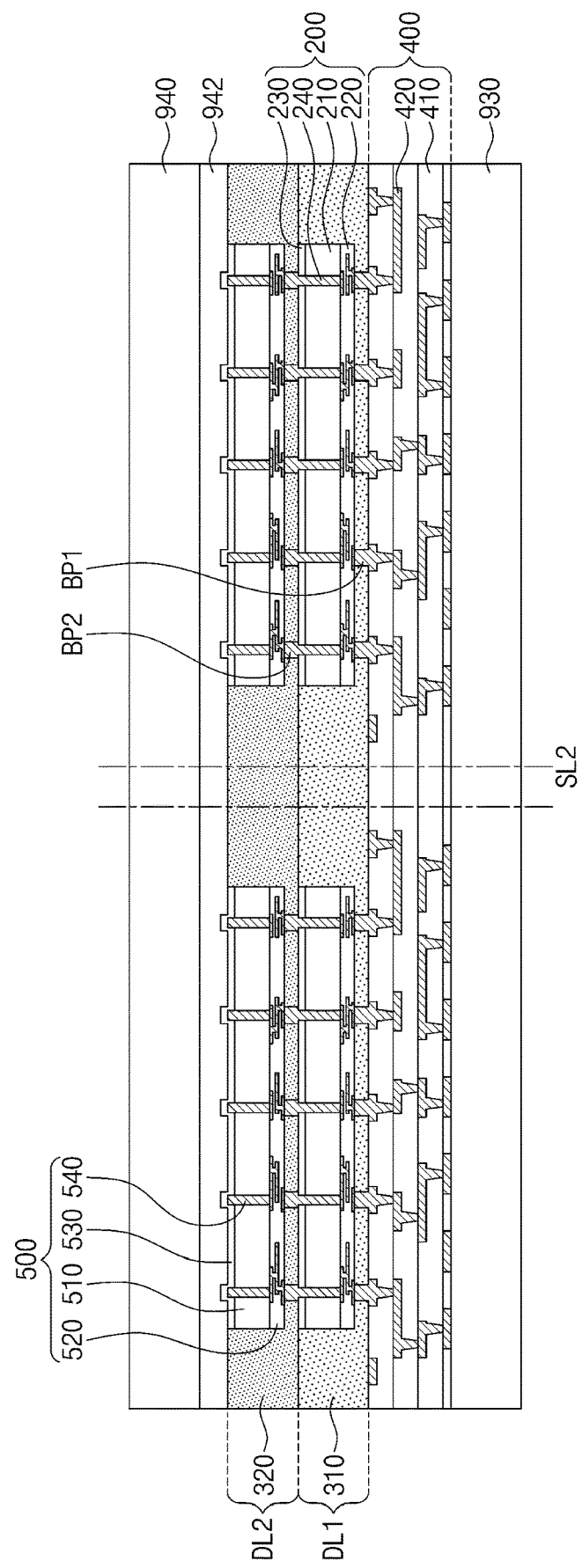

Referring to FIG. 21, the second device layer DL2 may be formed. A process of forming the second device layer DL2 may be substantially the same as or similar to the process of forming the first device layer DL1 described with reference to FIGS. 8 to 14. For example, a plurality of second dies 500 may be attached to a fourth carrier substrate 940. For example, a surface of the second passivation layer 530 may be attached to a fourth adhesive member 942. The second molding portion 320 may be formed on the fourth carrier substrate 940. The second molding portion 320 may cover side and top surfaces of the second dies 500 and side and top surfaces of the second bumps BP2. Thereafter, the second molding portion 320 may be thinned to expose the top surface of the second bumps BP2. The top surfaces of the second bumps BP2 and the top surface of the second molding portion 320 may be substantially flat and may be substantially coplanar to each other.

Referring further to FIG. 21, the fourth carrier substrate 940 may be disposed on the third carrier substrate 930. Here, the first device layer DL1 and the second device layer DL2 may be placed to face each other.

The second device layer DL2 may be bonded to the top surface of the first device layer DL1. For example, the third carrier substrate 930 and the fourth carrier substrate 940 may move toward each other such that the first molding portion 310 of the first device layer DL1 is in contact with the second molding portion 320 of the second device layer DL2. For example, the second bumps BP2, which are exposed to the outside near a surface of the second molding portion 320, may be in contact with the first vias 240, which are exposed to the outside near a surface of the first passivation layer 230. The second molding portion 320 may be in contact with the first passivation layer 230 of the first device layer DL1.

The second bumps BP2 and the first vias 240 may be bonded to form a single body or structure. The bonding of the second bumps BP2 and the first vias 240 may be naturally performed. For example, the second bumps BP2 and the first vias 240 may be formed of the same material (e.g., copper (Cu)), and in this case, the second bumps BP2 and the first via 240 may be bonded to each other through a metal-metal (e.g., copper-copper) hybrid bonding process, which is caused by surface activation at an interface between the second bumps BP2 and the first vias 240 in contact with each other. Since the second bumps BP2 and the first vias 240 are bonded to each other, the interface between the second bumps BP2 and the first vias 240 may disappear. Since the second bumps BP2 and the first vias 240 form the single body or structure, the second device layer DL2 may be robustly combined to the first device layer DL1.

Figure 22:
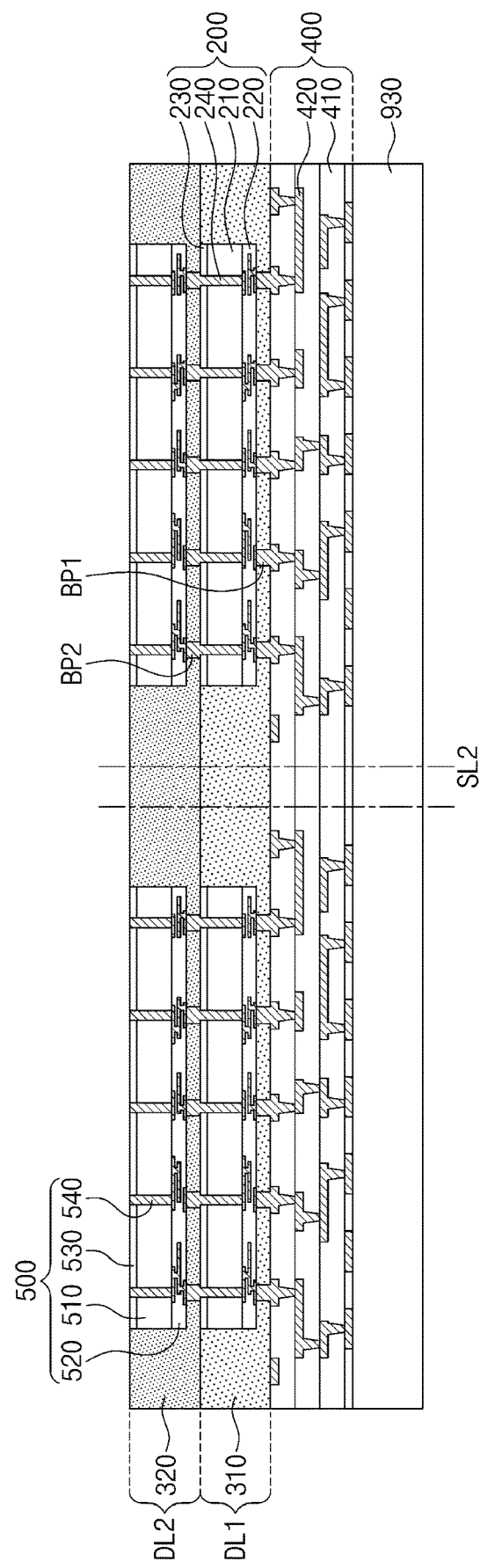

Referring to FIG. 22, the fourth carrier substrate 940 may be removed. For example, the fourth adhesive member 942 may be dissolved to detach or physically remove the fourth carrier substrate 940 from the structure of FIG. 21. Since the fourth carrier substrate 940 is removed, the second molding portion 320 and the second passivation layer 530 of the second die 500 may be exposed to the outside.

Next, a planarization process may be performed on the second molding portion 320. Accordingly, the second molding portion 320, the second passivation layer 530, and the second via 540 may be formed to have top surfaces that are substantially coplanar with each other and are substantially flat.

Figure 23:
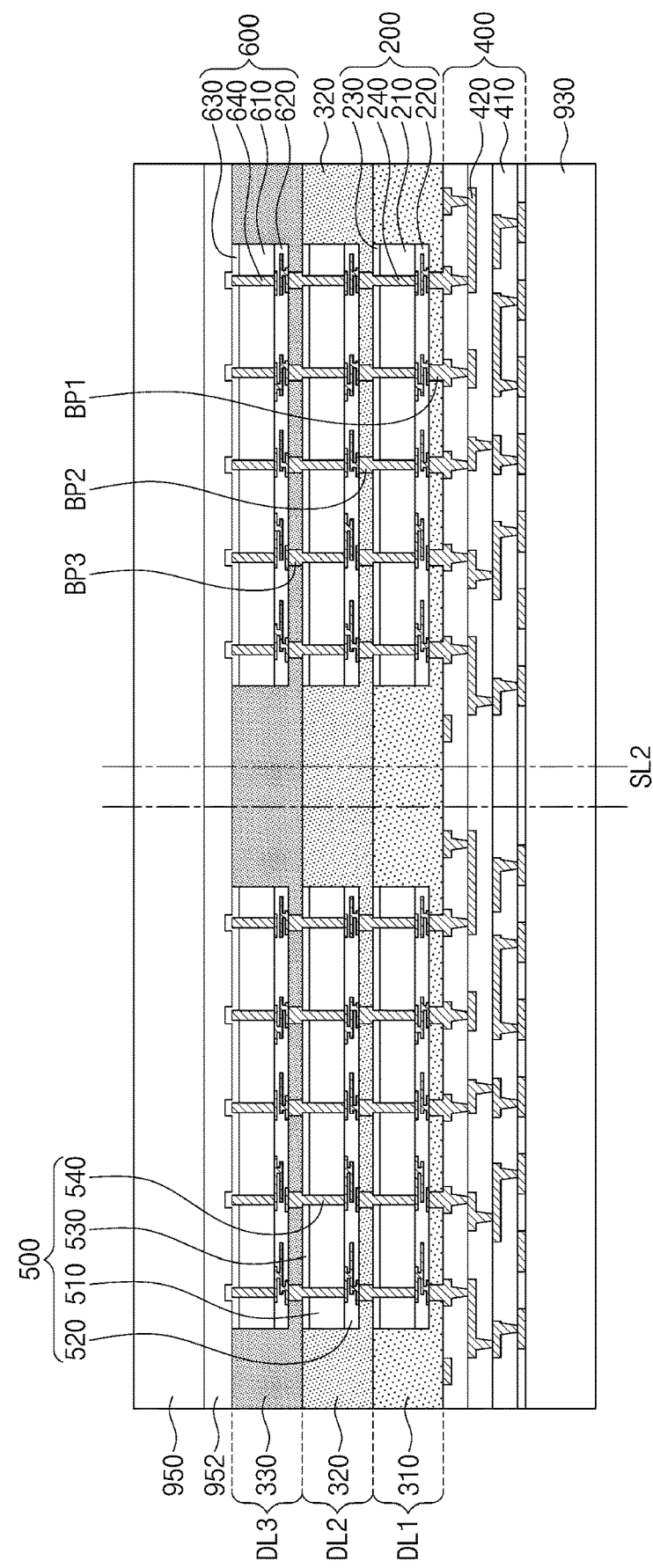

Referring to FIG. 23, the third device layer DL3 may be formed. A process of forming the third device layer DL3 may be substantially the same as or similar to the process of forming the first device layer DL1 described with reference to FIGS. 8 to 14. For example, a plurality of third dies 600 may be attached to a fifth carrier substrate 950. In an embodiment, a surface of the third passivation layer 630 may be attached to a fifth adhesive member 952. The third molding portion 330 may be formed on the fifth carrier substrate 950. The third molding portion 330 may cover the side and top surfaces of the third dies 600 and the side and top surfaces of the third bumps BP3. Thereafter, the third molding portion 330 may be thinned to expose the top surface of the third bumps BP3. The top surfaces of the third bumps BP3 and the top surface of the third molding portion 330 may be substantially flat and may be substantially coplanar to each other. In the process described with reference to FIG. 23, the third device layer DL3 may correspond to the first device layer DL1 described with reference to FIG. 6.

Referring further to FIG. 23, the fifth carrier substrate 950 may be disposed on the third carrier substrate 930. Here, the second device layer DL2 and the third device layer DL3 may be placed to face each other.

The third device layer DL3 may be bonded to the top surface of the second device layer DL2. For example, the third carrier substrate 930 and the fifth carrier substrate 950 may move toward each other such that the second molding portion 320 of the second device layer DL2 is in contact with the third molding portion 330 of the third device layer DL3. For example, the third bumps BP3, which are exposed to the outside near a surface of the third molding portion 330, may be in contact with the second vias 540, which are exposed to the outside near a surface of the second passivation layer 530. The third molding portion 330 may be in contact with the second passivation layer 530 of the second device layer DL2.

The third bumps BP3 and the second vias 540 may be bonded to form a single body or structure. The bonding of the third bumps BP3 and the second vias 540 may be naturally performed. For example, the third bumps BP3 and the second vias 540 may be formed of the same material (e.g., copper (Cu)), and in this case, the third bumps BP3 and the second vias 540 may be bonded to each other through a metal-metal (e.g., copper-copper) hybrid bonding process, which is caused by surface activation at an interface between the third bumps BP3 and the second vias 540 in contact with each other. Since the third bumps BP3 and the second vias 540 are bonded to each other, the interface between the third bumps BP3 and the second vias 540 may disappear. Since the third bumps BP3 and the second vias 540 form the single body or structure, the third device layer DL3 may be robustly combined to the second device layer DL2.

Figure 24:
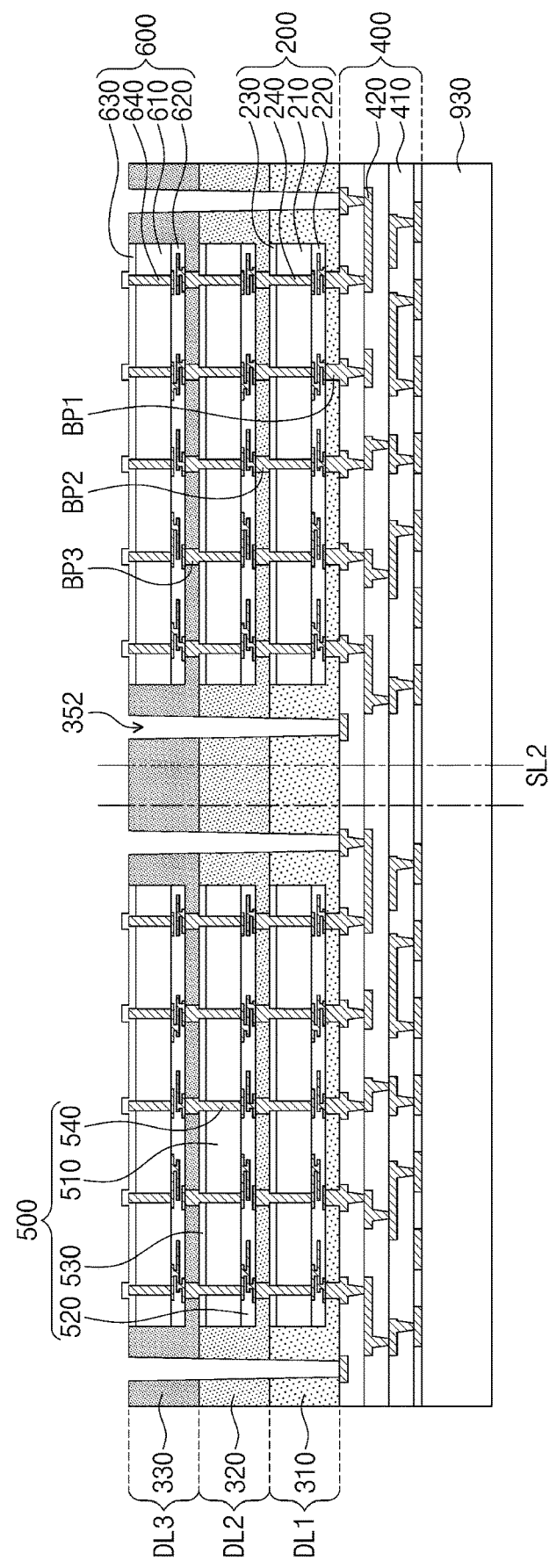

Referring to FIG. 24, the fifth carrier substrate 950 may be removed. For example, the fifth adhesive member 952 may be dissolved to detach or physically remove the fifth carrier substrate 950 from the structure of FIG. 23. Since the fifth carrier substrate 950 is removed, the third molding portion 330 and the third passivation layer 630 of the third die 600 may be exposed to the outside.

At least one penetration electrode hole 352 may be formed in the first molding portion 310, the second molding portion 320, and the third molding portion 330. The penetration electrode hole 352 may be formed in a region around the first die 200, the second die 500, and the third die 600, when viewed in a plan view. The penetration electrode hole 352 may be formed to vertically penetrate the first molding portion 310, the second molding portion 320, and the third molding portion 330 and to expose the second conductive pattern 420 of the second redistribution substrate 400. The penetration electrode hole 352 may be formed to have a width that decreases in a direction toward the second redistribution substrate 400.

Figure 25:
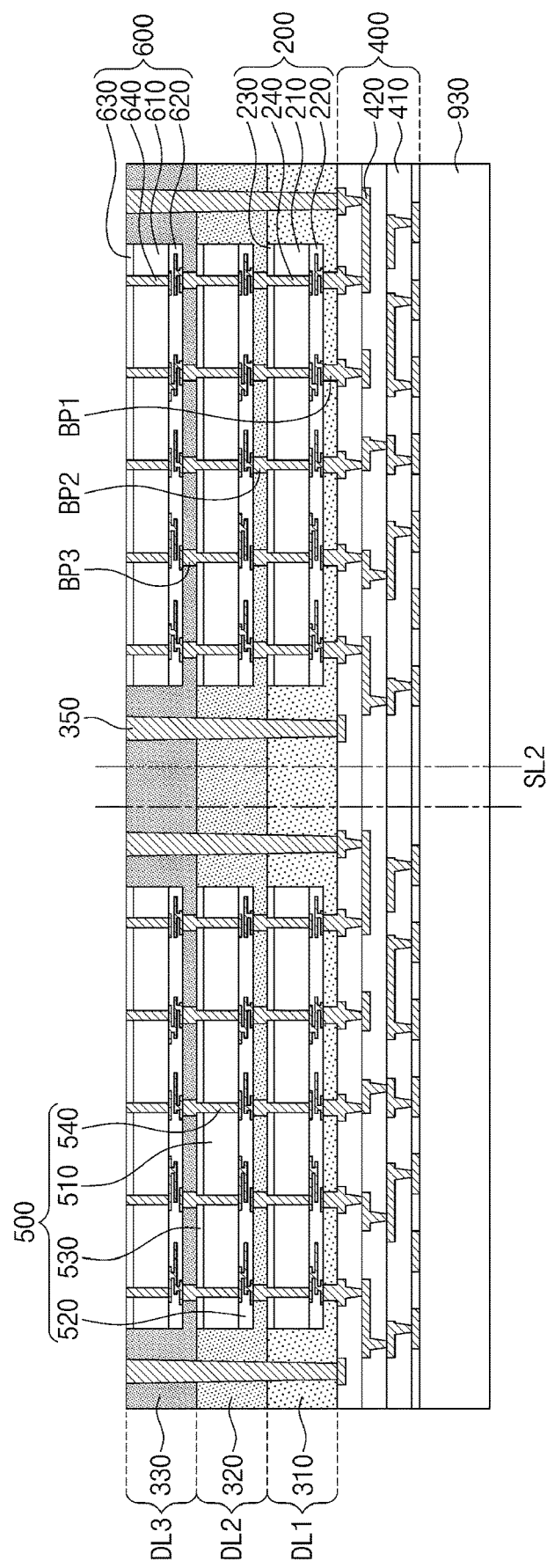

Referring to FIG. 25, the penetration electrode 350 may be formed. The penetration electrode 350 may be formed by filling the penetration electrode hole 352 with a metallic material. For example, a seed layer may be formed on the third molding portion 330. The seed layer may conformally cover the top surface of the third molding portion 330 and the inner side surface of the penetration electrode hole 352. Thereafter, an electroplating process using the seed layer as a seed may be performed to fill the penetration electrode hole 352 with the metallic material.

Next, a planarization process may be performed on the third molding portion 330. Accordingly, the penetration electrode 350, the third molding portion 330, the third passivation layer 630, and the third via 640 may be formed to have top surfaces that are substantially coplanar with each other and are substantially flat.

Figure 26:
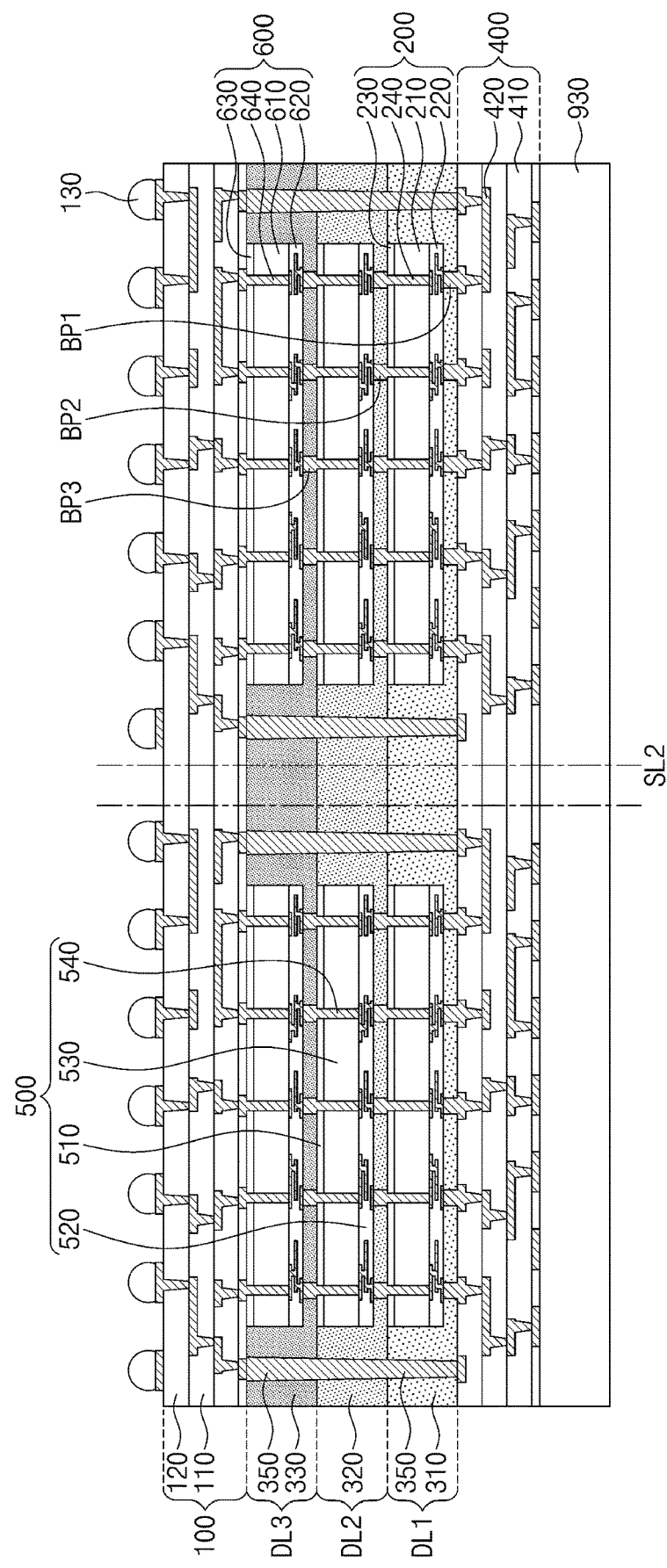

Referring to FIG. 26, the first redistribution substrate 100 may be formed on the third device layer DL3. The first redistribution substrate 100 may be formed by the same or similar method as that described with reference to FIG. 18. For example, the first insulating pattern 110 may be formed on the third device layer DL3, and the first conductive pattern 120 may be formed in the first insulating pattern 110. A redistribution layer may be formed by the afore-described method. The first insulating pattern 110 may be additionally formed on the redistribution layer. The first insulating pattern 110 may have a first opening, which exposes the first conductive pattern 120 of the redistribution layer therebelow, and a second opening, which is provided on the first opening and has a width larger than the first opening. The first conductive pattern 120 may be formed to fill the opening. Redistribution layers may be additionally formed on the redistribution layer through the afore-described method.

The outer terminals 130 may be provided on the first redistribution substrate 100. The outer terminals 130 may be formed on the first conductive patterns 120, which are exposed to the outside of the first redistribution substrate 100 near the top surface of the first redistribution substrate 100.

Next, a singulation process may be performed on the structure of FIG. 26. For example, the first redistribution substrate 100, the first molding portion 310, the second molding portion 320, the third molding portion 330, and the second redistribution substrate 400 may be cut to form a plurality of semiconductor packages that are separated from each other. In an embodiment, the singulation process may be performed along the second sawing line SL2 to form the plurality of semiconductor packages that are separated from each other.

The third carrier substrate 930 may be removed, after the singulation process. The semiconductor package of FIG. 6 may be manufactured through the afore-described method.

According to example embodiments, a first molding portion of a first device layer may be provided to cover an active surface of a first die, and thus, an integrated circuit of a first die may be protected from an external impact. In addition, the first molding portion and the first bump may be provided to have top surfaces that are substantially flat and are substantially coplanar with each other, and thus, a bonding process between the first device layer and a second redistribution substrate may be easily performed. Furthermore, since the first bump of the first device layer and a second conductive pattern of the second redistribution substrate are bonded to form a single body or structure, the first device layer and the second redistribution substrate may be robustly combined to each other. Accordingly, it may be possible to improve structural stability of the semiconductor package.

According to example embodiments, the first bumps may be provided to compensate a difference in height between the first dies, and thus, the first die may be reliably coupled to the second redistribution substrate by the first bumps. In addition, since the first bumps are provided to have a large thickness, a planarization process on top surfaces of the first bumps may be easily performed. Accordingly, it may be possible to easily perform the hybrid bonding process between the first device layer and the second redistribution substrate and to manufacture a robust semiconductor package.

While example embodiments have been described with reference to the drawings, it will be understood by one of ordinary skill in the art that variations in form and detail may be made therein without departing from the spirit and essential feature.

What is claimed is:

1. A semiconductor package, comprising:
   a first redistribution substrate;
   a first die above the first redistribution substrate;
   a second redistribution substrate on the first die;
   a first bump formed on the first die, and connecting the first die to the second redistribution substrate;
   a seed layer between the first bump and the first die, the seed layer being provided on a surface of the first bump facing the first die and on side surfaces of the first bump;
   a first molding portion enclosing the first die and surrounding the first bump;
   an outer terminal on a bottom surface of the first redistribution substrate;
   a second die between the first redistribution substrate and the first die; and
   a second bump between the first die and the second die, wherein the first bump is between the second die and the second redistribution substrate,
   wherein the second redistribution substrate comprises an insulating pattern and a conductive pattern in the insulating pattern to be in contact with the first bump, and wherein, at an interface of the second redistribution substrate and the first bump, the conductive pattern of the second redistribution substrate and the first bump are formed of the same material to form a single body or structure.

2. The semiconductor package of claim 1, wherein a top surface of the first molding portion and a top surface of the first bump are coplanar with each other.

3. The semiconductor package of claim 1, wherein the first die comprises:
- a base layer;
- a circuit layer on a top surface of the base layer;
- a passivation layer on a bottom surface of the base layer; and
- a via penetrating the base layer and the passivation layer, the via being coupled to the circuit layer,
wherein the first bump is provided on and coupled to the circuit layer.

4. The semiconductor package of claim 3, wherein the passivation layer of the first die is in contact with the first redistribution substrate, and
wherein the via is coupled to the first redistribution substrate.

5. The semiconductor package of claim 3, wherein a bottom surface of the passivation layer, a bottom surface of the via, and a bottom surface of the first molding portion are substantially coplanar with each other.

6. The semiconductor package of claim 1, wherein an active surface of the first die is spaced apart from the second redistribution substrate by the first bump.

7. The semiconductor package of claim 1, wherein the conductive pattern of the second redistribution substrate comprises a wiring pattern and a via pattern forming a single body or structure having a character "T" shape or an inverted character "T" shape, and
wherein the wiring pattern and the via pattern correspond to a horizontal stroke and a vertical stroke of the character "T" shape, respectively.

8. The semiconductor package of claim 1, further comprising a penetration electrode penetrating the first molding portion in a region around the first die to connects the first redistribution substrate to the second redistribution substrate.

9. The semiconductor package of claim 1, further comprising:
- a second molding portion enclosing the second die and surrounding the second bump.

10. The semiconductor package of claim 9, wherein a top surface of the second molding portion and a top surface of the second bump are coplanar with each other.

11. The semiconductor package of claim 9, wherein each of the first die and the second die comprises:
- a base layer;
- a circuit layer on a top surface of the base layer;
- a passivation layer on a bottom surface of the base layer; and
- a via penetrating the base layer and the passivation layer, the via being coupled to the circuit layer,
wherein the passivation layer of the first die is in contact with the second molding portion such that the via of the first die is coupled to the second bump, and
wherein the passivation layer of the second die is in contact with the first redistribution substrate such that the via of the second die is coupled to the first redistribution substrate.

12. The semiconductor package of claim 1, wherein a thickness of the first bump ranges from 0.1 mm to 10 mm.

13. A semiconductor package, comprising:
a first redistribution substrate;
a first device layer on the first redistribution substrate;
a second device layer on the first device layer;
a second redistribution substrate on the second device layer; and
outer terminals on a bottom surface of the first redistribution substrate,
wherein each of the first device layer and the second device layer comprises:
- a die comprising a circuit layer facing the second redistribution substrate;
- a via penetrating the die and coupled to the circuit layer;
- a bump formed on the die and coupled to the circuit layer;
- a seed layer between the bump and the circuit layer, the seed layer being provided on a surface of the bump facing the die and on side surfaces of the bump; and
- a molding portion surrounding the die and the bump,
wherein a top surface of the molding portion and a top surface of the bump are coplanar with each other,
wherein the bump of the first device layer is provided between the die of the first device layer and the die of the second device layer, and
wherein the bump of the second device layer is provided between the die of the second device layer and the second redistribution substrate,
wherein the second redistribution substrate comprises an insulating pattern and a conductive pattern in the insulating pattern,
wherein the conductive pattern comprises a head portion, which is exposed near a bottom surface of the insulating pattern and is coupled to the bump of the second device layer, and a tail portion which has a width smaller than the head portion, and
wherein, at an interface of the second redistribution substrate and the second device layer, the head portion of the conductive pattern of the second redistribution substrate and the bump of the second device layer are formed of the same material to form a single body or structure.

14. The semiconductor package of claim 13, further comprising a penetration electrode penetrating molding portions of the first device layer and the second device layer in a region around the die to connect the first redistribution substrate and the second redistribution substrate to each other,
wherein a top surface of the penetration electrode, a top surface of the molding portion of the second device layer, and a top surface of the bump of the second device layer are substantially coplanar with each other, and
wherein a bottom surface of the penetration electrode, a bottom surface of the molding portion of the first device layer, and a bottom surface of the die of the first device layer are substantially coplanar with each other.

15. The semiconductor package of claim 13, wherein an interface between the molding portion of the first device layer and the molding portion of the second device layer is located on the same plane as an interface between the bump of the first device layer and the die of the second device layer.

16. The semiconductor package of claim 13, wherein, at an interface of the first device layer and the second device layer, the bump of the first device layer and the via of the second device layer are formed of the same material to form a single body or structure.

17. A method of manufacturing a semiconductor package, comprising:
    forming a first die, which includes a first base layer, a first circuit layer on the first base layer, and a first via provided to penetrate the first base layer and coupled to the first circuit layer;
    forming a first pad on the circuit layer of the first die, the first pad being coupled to the first circuit layer;
    placing the first die on a first carrier substrate such that the first base layer faces the first carrier substrate;
    coating the first carrier substrate with a molding material to form a first molding portion encapsulating the first die;
    performing a planarization process on the first molding portion to expose the first pad;
    bonding the first die to a first redistribution substrate such that the first pad is coupled to the first redistribution substrate;
    removing the first carrier substrate to expose the first base layer;
    forming a penetration electrode to penetrate the first molding portion in a region around the first die and to be coupled to the first redistribution substrate; and
    forming a second redistribution substrate on the first molding portion and the first base layer of the first die, the second redistribution substrate comprising an insulating pattern and a conductive pattern in the insulating pattern to be in contact with the first bump;
    forming a second die between the first redistribution substrate and the first die;
    forming a first bump between the second die and the second redistribution substrate,
    wherein, at an interface of the second redistribution substrate and the first bump, the conductive pattern of the second redistribution substrate and the first bump are formed of the same material to form a single body or structure.

18. The method of claim 17, before forming the penetration electrode, further comprising:
    forming the second die comprises forming the second die, which includes a second base layer, a second circuit layer on the second base layer, and a second via provided to penetrate the second base layer and coupled to the second circuit layer;
    forming a second pad on the second circuit layer of the second die, the second pad is coupled to the second circuit layer;
    placing the second die on a second carrier substrate such that the second base layer of the second die faces the second carrier substrate;
    coating the second carrier substrate with the molding material to form a second molding portion encapsulating the second die;
    performing a planarization process on the second molding portion to expose the second pad; and
    bonding the second die to the first molding portion such that the second pad is coupled to the first via of the first die,
    wherein the penetration electrode is formed to penetrate the first molding portion and the second molding portion in a region around the first die and the second die, and
    wherein the second redistribution substrate is formed on the second molding portion and the second base layer of the second die.

19. The method of claim 17, wherein the first molding portion and the first pad have surfaces, which are coplanar with each other, through the planarization process on the first molding portion.

* * * * *